(12) United States Patent
Shero et al.

(10) Patent No.: US 9,167,625 B2
(45) Date of Patent: Oct. 20, 2015

(54) RADIATION SHIELDING FOR A SUBSTRATE HOLDER

(71) Applicant: ASM IP Holding B.V., Almere (NL)

(72) Inventors: Eric Shero, Phoenix, AZ (US); Michael Halpin, Scottsdale, AZ (US); Jerry Winkler, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 433 days.

(21) Appl. No.: 13/677,133

(22) Filed: Nov. 14, 2012

(65) Prior Publication Data

US 2013/0126515 A1 May 23, 2013

Related U.S. Application Data

(60) Provisional application No. 61/563,428, filed on Nov. 23, 2011.

(51) Int. Cl.
| | |
|---|---|
| *H05B 3/68* | (2006.01) |
| *A21B 2/00* | (2006.01) |
| *H05B 1/02* | (2006.01) |
| *H01L 21/67* | (2006.01) |

(52) U.S. Cl.
CPC ........ *H05B 1/0233* (2013.01); *H01L 21/67115* (2013.01); *H05B 3/68* (2013.01)

(58) Field of Classification Search
CPC ... H01L 21/67115; H05B 1/0233; H05B 3/68
USPC ..................... 219/443.1–468.2; 392/416–419
See application file for complete search history.

(56) References Cited

U.S. PATENT DOCUMENTS

| | | | |
|---|---|---|---|
| 2,745,640 | A | 5/1956 | Cushman |
| 2,990,045 | A | 9/1959 | Root |
| 3,833,492 | A | 9/1974 | Bollyky |
| 3,854,443 | A | 12/1974 | Baerg |
| 3,862,397 | A | 1/1975 | Anderson et al. |
| 3,887,790 | A | 6/1975 | Ferguson |
| 4,054,071 | A | 10/1977 | Patejak |
| 4,058,430 | A | 11/1977 | Suntola et al. |
| 4,145,699 | A | 3/1979 | Hu et al. |
| 4,176,630 | A | 12/1979 | Elmer |
| 4,181,330 | A | 1/1980 | Kojima |
| 4,194,536 | A | 3/1980 | Stine et al. |
| 4,322,592 | A | 3/1982 | Martin |

(Continued)

FOREIGN PATENT DOCUMENTS

| | | |
|---|---|---|
| CN | 1563483 A | 1/2005 |
| CN | 101330015 | 12/2008 |

(Continued)

OTHER PUBLICATIONS

USPTO; Final Office Action dated Jul. 14, 2014 in U.S. Appl. No. 12/754,223.

(Continued)

*Primary Examiner* — Sang Y Paik
(74) *Attorney, Agent, or Firm* — Snell & Wilmer LLP

(57) ABSTRACT

A reaction chamber including a substrate supporting member positioned within the reaction chamber, the reaction chamber having a first region and a second region, a shield positioned within the second chamber and movable with the substrate supporting member, and wherein the shield is adjacent at least a bottom surface of the substrate supporting member.

25 Claims, 13 Drawing Sheets

(56) References Cited

U.S. PATENT DOCUMENTS

| | | | |
|---|---|---|---|
| 4,389,973 A | 6/1983 | Suntola et al. | |
| 4,393,013 A | 7/1983 | McMenamin | |
| 4,436,674 A | 3/1984 | McMenamin | |
| 4,499,354 A | 2/1985 | Hill et al. | |
| 4,512,113 A | 4/1985 | Budinger | |
| 4,570,328 A | 2/1986 | Price et al. | |
| D288,556 S | 3/1987 | Wallgren | |
| 4,653,541 A | 3/1987 | Oehlschlaeger et al. | |
| 4,722,298 A | 2/1988 | Rubin et al. | |
| 4,735,259 A | 4/1988 | Vincent | |
| 4,753,192 A | 6/1988 | Goldsmith et al. | |
| 4,789,294 A | 12/1988 | Sato et al. | |
| 4,821,674 A | 4/1989 | deBoer et al. | |
| 4,827,430 A | 5/1989 | Aid et al. | |
| 4,882,199 A | 11/1989 | Sadoway et al. | |
| 4,986,215 A | 1/1991 | Yamada | |
| 4,991,614 A | 2/1991 | Hammel | |
| 5,062,386 A | 11/1991 | Christensen | |
| 5,074,017 A | 12/1991 | Toya et al. | |
| 5,119,760 A | 6/1992 | McMillan et al. | |
| 5,167,716 A | 12/1992 | Boitnott et al. | |
| 5,199,603 A | 4/1993 | Prescott | |
| 5,221,556 A | 6/1993 | Hawkins et al. | |
| 5,242,539 A | 9/1993 | Kumihashi et al. | |
| 5,243,195 A | 9/1993 | Nishi | |
| 5,326,427 A | 7/1994 | Jerbic | |
| 5,380,367 A | 1/1995 | Bertone | |
| 5,421,893 A | 6/1995 | Perlov | |
| 5,422,139 A | 6/1995 | Fischer | |
| 5,518,549 A | 5/1996 | Hellwig | |
| 5,595,606 A | 1/1997 | Fujikawa et al. | |
| 5,616,947 A | 4/1997 | Tamura | |
| 5,632,919 A | 5/1997 | MacCracken et al. | |
| 5,681,779 A | 10/1997 | Pasch et al. | |
| 5,695,567 A | 12/1997 | Kordina | |
| 5,730,801 A | 3/1998 | Tepman | |
| 5,732,744 A | 3/1998 | Barr et al. | |
| 5,736,314 A | 4/1998 | Hayes et al. | |
| 5,796,074 A | 8/1998 | Edelstein et al. | |
| 5,836,483 A | 11/1998 | Disel | |
| 5,837,320 A | 11/1998 | Hampden-Smith et al. | |
| 5,855,680 A | 1/1999 | Soininen et al. | |
| 5,920,798 A | 7/1999 | Higuchi et al. | |
| 5,979,506 A | 11/1999 | Aarseth | |
| 6,013,553 A | 1/2000 | Wallace | |
| 6,015,465 A | 1/2000 | Kholodenko et al. | |
| 6,035,101 A * | 3/2000 | Sajoto et al. | 392/416 |
| 6,060,691 A | 5/2000 | Minami et al. | |
| 6,074,443 A | 6/2000 | Venkatesh | |
| 6,083,321 A | 7/2000 | Lei et al. | |
| 6,086,677 A | 7/2000 | Umotoy et al. | |
| 6,122,036 A | 9/2000 | Yamasaki et al. | |
| 6,125,789 A | 10/2000 | Gupta et al. | |
| 6,129,044 A | 10/2000 | Zhao et al. | |
| 6,148,761 A | 11/2000 | Majewski et al. | |
| 6,160,244 A | 12/2000 | Ohashi | |
| 6,161,500 A | 12/2000 | Kopacz et al. | |
| 6,201,999 B1 | 3/2001 | Jevtic | |
| 6,274,878 B1 | 8/2001 | Li et al. | |
| 6,287,965 B1 | 9/2001 | Kang et al. | |
| 6,302,964 B1 | 10/2001 | Umotoy et al. | |
| 6,312,525 B1 | 11/2001 | Bright et al. | |
| D451,893 S | 12/2001 | Robson | |
| D452,220 S | 12/2001 | Robson | |
| 6,326,597 B1 | 12/2001 | Lubomirsky et al. | |
| 6,342,427 B1 | 1/2002 | Choi et al. | |
| 6,367,410 B1 | 4/2002 | Leahey et al. | |
| 6,368,987 B1 | 4/2002 | Kopacz et al. | |
| 6,383,566 B1 | 5/2002 | Zagdoun | |
| 6,410,459 B2 | 6/2002 | Blalock et al. | |
| 6,420,279 B1 | 7/2002 | Ono et al. | |
| 6,454,860 B2 | 9/2002 | Metzner et al. | |
| 6,478,872 B1 | 11/2002 | Chae et al. | |
| 6,482,331 B2 | 11/2002 | Lu et al. | |
| 6,483,989 B1 | 11/2002 | Okada et al. | |
| 6,511,539 B1 | 1/2003 | Raaijmakers | |
| 6,521,295 B1 | 2/2003 | Remington | |
| 6,534,395 B2 | 3/2003 | Werkhoven et al. | |
| 6,569,239 B2 | 5/2003 | Arai et al. | |
| 6,579,833 B1 | 6/2003 | McNallan et al. | |
| 6,590,251 B2 | 7/2003 | Kang et al. | |
| 6,594,550 B1 | 7/2003 | Okrah | |
| 6,598,559 B1 | 7/2003 | Vellore et al. | |
| 6,627,503 B2 | 9/2003 | Ma et al. | |
| 6,633,364 B2 | 10/2003 | Hayashi | |
| 6,645,304 B2 | 11/2003 | Yamaguchi | |
| 6,648,974 B1 | 11/2003 | Ogliari et al. | |
| 6,673,196 B1 * | 1/2004 | Oyabu | 156/345.31 |
| 6,682,973 B1 | 1/2004 | Paton et al. | |
| 6,709,989 B2 | 3/2004 | Ramdani et al. | |
| 6,710,364 B2 | 3/2004 | Guldi et al. | |
| 6,734,090 B2 | 5/2004 | Agarwala et al. | |
| 6,820,570 B2 | 11/2004 | Kilpela et al. | |
| 6,821,910 B2 | 11/2004 | Adomaitis et al. | |
| 6,824,665 B2 | 11/2004 | Shelnut et al. | |
| 6,847,014 B1 | 1/2005 | Benjamin et al. | |
| 6,858,524 B2 | 2/2005 | Haukka et al. | |
| 6,858,547 B2 | 2/2005 | Metzner | |
| 6,863,019 B2 | 3/2005 | Shamouilian | |
| 6,874,480 B1 | 4/2005 | Ismailov | |
| 6,875,677 B1 | 4/2005 | Conley, Jr. et al. | |
| 6,884,066 B2 | 4/2005 | Nguyen et al. | |
| 6,884,319 B2 | 4/2005 | Kim | |
| 6,889,864 B2 | 5/2005 | Lindfors et al. | |
| 6,909,839 B2 | 6/2005 | Wang et al. | |
| 6,930,059 B2 | 8/2005 | Conley, Jr. et al. | |
| 6,935,269 B2 | 8/2005 | Lee et al. | |
| 6,955,836 B2 | 10/2005 | Kumagai et al. | |
| 6,972,478 B1 | 12/2005 | Waite et al. | |
| 7,045,430 B2 | 5/2006 | Ahn et al. | |
| 7,053,009 B2 | 5/2006 | Conley, Jr. et al. | |
| 7,071,051 B1 | 7/2006 | Jeon et al. | |
| 7,115,838 B2 | 10/2006 | Kurara et al. | |
| 7,122,085 B2 | 10/2006 | Shero et al. | |
| 7,129,165 B2 | 10/2006 | Basol et al. | |
| 7,132,360 B2 | 11/2006 | Schaeffer et al. | |
| 7,135,421 B2 | 11/2006 | Ahn et al. | |
| 7,147,766 B2 | 12/2006 | Uzoh et al. | |
| 7,172,497 B2 | 2/2007 | Basol et al. | |
| 7,192,824 B2 | 3/2007 | Ahn et al. | |
| 7,192,892 B2 | 3/2007 | Ahn et al. | |
| 7,195,693 B2 | 3/2007 | Cowans | |
| 7,204,887 B2 | 4/2007 | Kawamura et al. | |
| 7,205,247 B2 | 4/2007 | Lee et al. | |
| 7,235,501 B2 | 6/2007 | Ahn et al. | |
| 7,238,596 B2 | 7/2007 | Kouvetakis et al. | |
| D553,104 S | 10/2007 | Oohashi et al. | |
| 7,298,009 B2 | 11/2007 | Yan et al. | |
| D557,226 S | 12/2007 | Uchino et al. | |
| 7,312,494 B2 | 12/2007 | Ahn et al. | |
| 7,329,947 B2 | 2/2008 | Adachi et al. | |
| 7,357,138 B2 | 4/2008 | Ji et al. | |
| 7,393,418 B2 | 7/2008 | Yokogawa | |
| 7,393,736 B2 | 7/2008 | Ahn et al. | |
| 7,402,534 B2 | 7/2008 | Mahajani | |
| 7,405,166 B2 | 7/2008 | Liang et al. | |
| 7,405,454 B2 | 7/2008 | Ahn et al. | |
| 7,414,281 B1 | 8/2008 | Fastow | |
| 7,431,966 B2 | 10/2008 | Derderian et al. | |
| 7,437,060 B2 | 10/2008 | Wang et al. | |
| 7,442,275 B2 | 10/2008 | Cowans | |
| 7,489,389 B2 | 2/2009 | Shibazaki | |
| D593,969 S | 6/2009 | Li | |
| 7,547,363 B2 | 6/2009 | Tomiyasu et al. | |
| 7,575,968 B2 | 8/2009 | Sadaka et al. | |
| 7,589,003 B2 | 9/2009 | Kouvetakis et al. | |
| 7,601,223 B2 | 10/2009 | Lindfors et al. | |
| 7,601,225 B2 | 10/2009 | Tuominen et al. | |
| 7,640,142 B2 | 12/2009 | Tachikawa et al. | |
| 7,651,583 B2 | 1/2010 | Kent et al. | |
| D609,655 S | 2/2010 | Sugimoto | |
| 7,678,197 B2 | 3/2010 | Maki | |
| D614,153 S | 4/2010 | Fondurulia et al. | |
| 7,720,560 B2 | 5/2010 | Menser et al. | |

(56) References Cited

U.S. PATENT DOCUMENTS

| | | | |
|---|---|---|---|
| 7,723,648 | B2 | 5/2010 | Tsukamoto et al. |
| 7,740,705 | B2 | 6/2010 | Li |
| 7,780,440 | B2 | 8/2010 | Shibagaki et al. |
| 7,833,353 | B2 | 11/2010 | Furukawahara et al. |
| 7,838,084 | B2 | 11/2010 | Derderian et al. |
| 7,851,019 | B2 | 12/2010 | Tuominen et al. |
| 7,884,918 | B2 | 2/2011 | Hattori |
| D634,719 | S | 3/2011 | Yasuda et al. |
| 8,041,197 | B2 | 10/2011 | Kasai et al. |
| 8,055,378 | B2 | 11/2011 | Numakura |
| 8,071,452 | B2 | 12/2011 | Raisanen |
| 8,072,578 | B2 | 12/2011 | Yasuda |
| 8,076,230 | B2 | 12/2011 | Wei |
| 8,076,237 | B2 | 12/2011 | Uzoh |
| 8,082,946 | B2 | 12/2011 | Laverdiere et al. |
| 8,092,604 | B2 | 1/2012 | Tomiyasu et al. |
| 8,137,462 | B2 | 3/2012 | Fondurulia et al. |
| 8,147,242 | B2 | 4/2012 | Shibagaki et al. |
| 8,216,380 | B2 | 7/2012 | White et al. |
| 8,278,176 | B2 | 10/2012 | Bauer et al. |
| 8,282,769 | B2 | 10/2012 | Iizuka |
| 8,287,648 | B2 | 10/2012 | Reed et al. |
| 8,293,016 | B2 | 10/2012 | Bahng et al. |
| 8,309,173 | B2 | 11/2012 | Tuominen et al. |
| 8,323,413 | B2 | 12/2012 | Son |
| 8,367,528 | B2 | 2/2013 | Bauer et al. |
| 8,372,204 | B2 | 2/2013 | Nakamura |
| 8,444,120 | B2 | 5/2013 | Gregg et al. |
| 8,506,713 | B2 * | 8/2013 | Takagi .................... 118/715 |
| D691,974 | S | 10/2013 | Osada et al. |
| 8,608,885 | B2 | 12/2013 | Goto et al. |
| 8,683,943 | B2 | 4/2014 | Onodera et al. |
| 8,711,338 | B2 | 4/2014 | Liu et al. |
| D705,745 | S | 5/2014 | Kurs et al. |
| 8,726,837 | B2 | 5/2014 | Patalay et al. |
| 8,728,832 | B2 | 5/2014 | Raisanen et al. |
| 8,802,201 | B2 | 8/2014 | Raisanen et al. |
| D716,742 | S | 11/2014 | Jang et al. |
| 8,877,655 | B2 | 11/2014 | Shero et al. |
| 8,883,270 | B2 | 11/2014 | Shero et al. |
| 8,986,456 | B2 | 3/2015 | Fondurulia et al. |
| 8,993,054 | B2 | 3/2015 | Jung et al. |
| 9,005,539 | B2 | 4/2015 | Halpin et al. |
| 9,017,481 | B1 | 4/2015 | Pettinger et al. |
| 9,018,111 | B2 | 4/2015 | Milligan et al. |
| 9,021,985 | B2 | 5/2015 | Alokozai et al. |
| 9,029,253 | B2 | 5/2015 | Milligan et al. |
| 9,096,931 | B2 | 8/2015 | Yednak et al. |
| 2001/0017103 | A1 | 8/2001 | Takeshita et al. |
| 2001/0046765 | A1 | 11/2001 | Cappellani et al. |
| 2002/0001974 | A1 | 1/2002 | Chan |
| 2002/0011210 | A1 | 1/2002 | Satoh et al. |
| 2002/0064592 | A1 | 5/2002 | Datta et al. |
| 2002/0098627 | A1 | 7/2002 | Pomarede et al. |
| 2002/0108670 | A1 | 8/2002 | Baker et al. |
| 2002/0115252 | A1 | 8/2002 | Haukka et al. |
| 2002/0172768 | A1 | 11/2002 | Endo et al. |
| 2002/0187650 | A1 | 12/2002 | Blalock et al. |
| 2003/0019580 | A1 | 1/2003 | Strang |
| 2003/0025146 | A1 | 2/2003 | Narwankar et al. |
| 2003/0040158 | A1 | 2/2003 | Saitoh |
| 2003/0042419 | A1 | 3/2003 | Katsumata et al. |
| 2003/0066826 | A1 | 4/2003 | Lee et al. |
| 2003/0075925 | A1 | 4/2003 | Lindfors et al. |
| 2003/0094133 | A1 | 5/2003 | Yoshidome et al. |
| 2003/0111963 | A1 | 6/2003 | Tolmachev et al. |
| 2003/0141820 | A1 | 7/2003 | White et al. |
| 2003/0168001 | A1 | 9/2003 | Sneh |
| 2003/0180458 | A1 | 9/2003 | Sneh |
| 2003/0228772 | A1 | 12/2003 | Cowans |
| 2003/0232138 | A1 | 12/2003 | Tuominen et al. |
| 2004/0009679 | A1 | 1/2004 | Yeo et al. |
| 2004/0013577 | A1 | 1/2004 | Ganguli et al. |
| 2004/0018307 | A1 | 1/2004 | Park et al. |
| 2004/0018750 | A1 | 1/2004 | Sophie et al. |
| 2004/0023516 | A1 | 2/2004 | Londergan et al. |
| 2004/0036129 | A1 | 2/2004 | Forbes et al. |
| 2004/0106249 | A1 | 2/2004 | Huotari |
| 2004/0077182 | A1 | 4/2004 | Lim et al. |
| 2004/0101622 | A1 | 5/2004 | Park et al. |
| 2004/0144980 | A1 | 7/2004 | Ahn et al. |
| 2004/0168627 | A1 | 9/2004 | Conley et al. |
| 2004/0169032 | A1 * | 9/2004 | Murayama et al. ........... 219/411 |
| 2004/0198069 | A1 | 10/2004 | Metzner et al. |
| 2004/0200499 | A1 | 10/2004 | Harvey et al. |
| 2004/0219793 | A1 | 11/2004 | Hishiya et al. |
| 2004/0221807 | A1 | 11/2004 | Verghese et al. |
| 2004/0266011 | A1 | 12/2004 | Lee et al. |
| 2005/0008799 | A1 | 1/2005 | Tomiyasu et al. |
| 2005/0019026 | A1 | 1/2005 | Wang et al. |
| 2005/0020071 | A1 | 1/2005 | Sonobe et al. |
| 2005/0023624 | A1 | 2/2005 | Ahn et al. |
| 2005/0054228 | A1 | 3/2005 | March |
| 2005/0066893 | A1 | 3/2005 | Soininen |
| 2005/0070123 | A1 | 3/2005 | Hirano |
| 2005/0072357 | A1 | 4/2005 | Shero et al. |
| 2005/0092249 | A1 | 5/2005 | Kilpela et al. |
| 2005/0100669 | A1 | 5/2005 | Kools et al. |
| 2005/0106893 | A1 | 5/2005 | Wilk |
| 2005/0110069 | A1 | 5/2005 | Kil et al. |
| 2005/0123690 | A1 | 6/2005 | Derderian et al. |
| 2005/0173003 | A1 | 8/2005 | Laverdiere et al. |
| 2005/0187647 | A1 | 8/2005 | Wang et al. |
| 2005/0212119 | A1 | 9/2005 | Shero |
| 2005/0214457 | A1 | 9/2005 | Schmitt et al. |
| 2005/0214458 | A1 | 9/2005 | Meiere |
| 2005/0218462 | A1 | 10/2005 | Ahn et al. |
| 2005/0229848 | A1 | 10/2005 | Shinriki |
| 2005/0229972 | A1 | 10/2005 | Hoshi et al. |
| 2005/0241176 | A1 | 11/2005 | Shero et al. |
| 2005/0263075 | A1 | 12/2005 | Wang et al. |
| 2005/0271813 | A1 | 12/2005 | Kher et al. |
| 2005/0282101 | A1 | 12/2005 | Adachi |
| 2005/0287725 | A1 | 12/2005 | Kitagawa |
| 2006/0013946 | A1 | 1/2006 | Park et al. |
| 2006/0014384 | A1 | 1/2006 | Lee et al. |
| 2006/0019033 | A1 | 1/2006 | Muthukrishnan et al. |
| 2006/0024439 | A2 | 2/2006 | Tuominen et al. |
| 2006/0046518 | A1 | 3/2006 | Hill et al. |
| 2006/0051925 | A1 | 3/2006 | Ahn et al. |
| 2006/0060930 | A1 | 3/2006 | Metz et al. |
| 2006/0062910 | A1 | 3/2006 | Meiere |
| 2006/0063346 | A1 | 3/2006 | Lee et al. |
| 2006/0068125 | A1 | 3/2006 | Radhakrishnan |
| 2006/0110934 | A1 | 5/2006 | Fukuchi |
| 2006/0113675 | A1 | 6/2006 | Chang et al. |
| 2006/0128168 | A1 | 6/2006 | Ahn et al. |
| 2006/0148180 | A1 | 7/2006 | Ahn et al. |
| 2006/0163612 | A1 | 7/2006 | Kouvetakis et al. |
| 2006/0193979 | A1 | 8/2006 | Meiere et al. |
| 2006/0208215 | A1 | 9/2006 | Metzner et al. |
| 2006/0213439 | A1 | 9/2006 | Ishizaka |
| 2006/0223301 | A1 | 10/2006 | Vanhaelemeersch et al. |
| 2006/0226117 | A1 | 10/2006 | Bertram et al. |
| 2006/0228888 | A1 | 10/2006 | Lee et al. |
| 2006/0240574 | A1 * | 10/2006 | Yoshie .............................. 438/1 |
| 2006/0257563 | A1 | 11/2006 | Doh et al. |
| 2006/0257584 | A1 | 11/2006 | Derderian et al. |
| 2006/0258078 | A1 | 11/2006 | Lee et al. |
| 2006/0266289 | A1 | 11/2006 | Verghese et al. |
| 2007/0010072 | A1 | 1/2007 | Bailey et al. |
| 2007/0020953 | A1 | 1/2007 | Tsai et al. |
| 2007/0022954 | A1 | 2/2007 | Iizuka et al. |
| 2007/0028842 | A1 | 2/2007 | Inagawa et al. |
| 2007/0031598 | A1 | 2/2007 | Okuyama et al. |
| 2007/0031599 | A1 | 2/2007 | Gschwandtner et al. |
| 2007/0037412 | A1 | 2/2007 | Dip et al. |
| 2007/0042117 | A1 | 2/2007 | Kupurao et al. |
| 2007/0049053 | A1 | 3/2007 | Mahajani |
| 2007/0059948 | A1 | 3/2007 | Metzner et al. |
| 2007/0065578 | A1 | 3/2007 | McDougall |
| 2007/0066010 | A1 | 3/2007 | Ando |
| 2007/0077355 | A1 | 4/2007 | Chacin et al. |
| 2007/0084405 | A1 | 4/2007 | Kim |

(56) References Cited

U.S. PATENT DOCUMENTS

| | | |
|---|---|---|
| 2007/0096194 A1 | 5/2007 | Streck et al. |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0163440 A1 | 7/2007 | Kim et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0237697 A1 | 10/2007 | Clark |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0248310 A1 | 10/2008 | Kim et al. |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0139657 A1 | 6/2009 | Lee et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0102417 A1 | 4/2010 | Ganguli et al. |
| 2010/0124610 A1 | 5/2010 | Aikawa et al. |
| 2010/0130017 A1 | 5/2010 | Luo et al. |
| 2010/0162752 A1 | 7/2010 | Tabata et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0089469 A1 | 4/2011 | Merckling |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0254052 A1 | 10/2011 | Kouvetakis |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070136 A1* | 3/2012 | Koelmel et al. ............... 392/416 |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0318334 A1 | 12/2012 | Bedell et al. |
| 2012/0321786 A1 | 12/2012 | Satitpunwaycha et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2013/0330911 A1 | 12/2013 | Huang et al. |
| 2014/0000843 A1 | 1/2014 | Dunn et al. |
| 2014/0014644 A1 | 1/2014 | Akiba et al. |
| 2014/0020619 A1 | 1/2014 | Vincent et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2014/0087544 A1 | 12/2014 | Tolle |
| 2015/0004316 A1 | 1/2015 | Thompson et al. |
| 2015/0014632 A1 | 1/2015 | Kim et al. |
| 2015/0024609 A1 | 1/2015 | Milligan et al. |
| 2015/0048485 A1 | 2/2015 | Tolle |
| 2015/0091057 A1 | 4/2015 | Xie et al. |
| 2015/0096973 A1 | 4/2015 | Dunn et al. |
| 2015/0132212 A1 | 5/2015 | Winkler et al. |
| 2015/0140210 A1 | 5/2015 | Jung et al. |
| 2015/0147877 A1 | 5/2015 | Jung |
| 2015/0167159 A1 | 6/2015 | Halpin et al. |
| 2015/0184291 A1 | 7/2015 | Alokozai et al. |
| 2015/0187568 A1 | 7/2015 | Pettinger et al. |

FOREIGN PATENT DOCUMENTS

| | | |
|---|---|---|
| CN | 101522943 | 9/2009 |
| CN | 101423937 | 9/2011 |
| EP | 2036600 | 3/2009 |
| JP | 07283149 | 10/1995 |
| JP | 08335558 | 12/1996 |
| JP | 2001342570 | 12/2001 |
| JP | 2004014952 A | 1/2004 |
| JP | 2004091848 | 3/2004 |
| JP | 2004538374 | 12/2004 |

(56) References Cited

FOREIGN PATENT DOCUMENTS

| JP | 2005507030 | 3/2005 |
|---|---|---|
| JP | 2006186271 | 7/2006 |
| JP | 2008527748 | 7/2008 |
| TW | I226380 | 1/2005 |
| TW | 200701301 A | 1/2007 |
| WO | 2006056091 A1 | 6/2006 |
| WO | 2006/078666 | 7/2006 |

OTHER PUBLICATIONS

USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTa1-xN Alloys of Rocksalt Structure. Journal of Applied Physics, 110, pp. 043535-1-043535-6, (2011).
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Office Action dated Apr. 23, 2013 in U.S. Appl. No. 12/763,037.
USPTO; Office Action dated Jan. 15, 2013 in U.S. Appl. No. 12/754,223.
USPTO; Office Action dated Feb. 26, 2013 in U.S. Appl. No. 12/754,223.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
USPTO; Office Action dated Dec. 6, 2012 in U.S. Appl. No. 12/854,818.
USPTO; Office Action dated Jan. 10, 2013 in U.S. Appl. No. 13/339,609.
USPTO; Office Action dated Feb. 11, 2013 in U.S. Appl. No. 13/339,609.
Chinese Patent Office; Office Action dated Jan. 10, 2013 is Serial No. 201080015699.9.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.

(56) References Cited

OTHER PUBLICATIONS

Taiwan Patent Office; Office Action dated Dec. 19, 2014 in Application No. 099127063.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Restriction Requirement dated Sep. 25, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Dec. 25, 2014 in Serial No. 2012-504786.
USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Final Office Action dated Mar. 13, 2015 in U.S. Appl. No. 13/597,043.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology A 21.5, (2003): S88-S95.
Varma, et al., "Effect of Mtal Halides on Thermal, Mechanical, and Electrical Properties of Polypyromelitimide Films," Journal of Applied Polymer Science, vol. 32, pp. 3987-4000, (1986).
USPTO; Final Office Action dated Aug. 12, 2015 in U.S. Appl. No. 12/754,223.
USPTO; Non-Final Office Action dated Jun. 17, 2015 in U.S. Appl. No. 13/283,408.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Notice of Allowance dated Aug. 4, 2015 in U.S. Appl. No. 13/677,133.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Final Office Action dated Jul. 14, 2015 in U.S. Appl. No. 14/457,058.
USPTO; Notice of Allowance dated Jul. 6, 2015 in U.S. Appl. No. 29/447,298.

* cited by examiner

RADIATION SHIELDING FOR A SUBSTRATE HOLDER

CROSS-REFERENCE TO RELATED APPLICATIONS

This application claims the benefit of U.S. Provisional Application No. 61/563,428, filed on Nov. 23, 2011, the disclosure of which is hereby incorporated herein by reference.

BACKGROUND

It can be difficult to heat a substrate being processed in a substrate processing tool. Variation in substrate heating may lead to within-substrate temperature variations. Such within-substrate temperature variations may lead to within-substrate processing non-uniformities. In some settings, substrates exhibiting such non-uniformities may produce defective devices. Further, deposition product may be deposited in the lower processing chamber, leading to reduced temperatures in the reaction chamber and therefore increased power consumption to overcome the inadequate heating. Additionally, the build-up of deposition product in the chamber can lead to premature chamber cleaning requirements and increased cost.

SUMMARY

Aspects of this document relate to reaction chambers for processing substrates. In one aspect, a reaction chamber includes a substrate supporting member positioned within the reaction chamber, the reaction chamber having a first region and a second region, a shield positioned within the second region and movable with the substrate supporting member, and wherein the shield is adjacent at least a bottom surface of the substrate supporting member.

In an implementation, the shield may be adjacent a sidewall of the substrate supporting member. The first region may be a substrate processing region and the second region may be a substrate loading region. The first region may be positioned above the second region in the reaction chamber. The reaction chamber may further include an isolation device at least partially separating the first and second regions. The reaction chamber may further include a gap formed between the shield and the isolation device. The gap may be between 5 and 10 mm. The shield may be spaced from the substrate supporting member between 5 and 20 mm.

The shield may further include a bottom member and a sidewall member. The bottom member and the sidewall member may connect to one another at an angle of approximately 90 degrees. The bottom member and the sidewall member may connect to one another at an angle between approximately 25 and 65 degrees. The shield may be secured to a shaft of the substrate supporting member. The shield may retain heat generated by the substrate support assembly. The substrate support assembly may further include a heater.

In another aspect, a shield for processing a substrate may include a bottom member having an aperture to surround a substrate support member shaft, a sidewall member extending upward at an angle from the bottom member, wherein the bottom member is positioned below the substrate support member and the sidewall member is positioned around the substrate support member, and wherein the shield moves vertically with the substrate support member.

In an implementation, the shield may be spaced from the substrate supporting member between 5 and 20 mm. The shield sidewall member may avoid contact with a reaction chamber wall. The sidewall may further include a top surface spaced from a reaction chamber surface between approximately 5 and 10 mm.

In another aspect, a reaction chamber may include a first region, a second region, and a third region, the first region positioned above the second and third regions, and adapted for processing a substrate, the second region positioned below the first region and adapted for loading the substrate in the reaction chamber, the third region positioned between the first region and the second region, and wherein the third region is movable within the second region.

In an implementation, the reaction chamber may further include a shield defining a barrier between the second region and the third region. The shield may be movable within the second region. A third region volume varies based on a position of the substrate support member.

In still another aspect, a method of heating a substrate in a processing region includes providing a shield within the processing chamber below a substrate support member, loading a substrate in a processing region of the processing chamber, activating a heater, and radiating heat from the shield to the substrate support member.

In an implementation, the method may further include the step of moving the substrate support member from a loading position to a processing position. The method may further include the step of monitoring the temperature of a cavity between the substrate support member and the shield.

Aspects and implementations of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning of the terms be applied to the interpretation of the specification and claims.

The inventors are also aware of the normal precepts of English grammar Thus, if a noun, term, or phrase is intended to be further characterized, specified, or narrowed in some way, then such noun, term, or phrase will expressly include additional adjectives, descriptive terms, or other modifiers in accordance with the normal precepts of English grammar Absent the use of such adjectives, descriptive terms, or modifiers, it is the intent that such nouns, terms, or phrases be given their plain, and ordinary English meaning to those skilled in the applicable arts as set forth above.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Embodiments of the present invention will hereinafter be described in conjunction with the appended drawings, where like designations denote like elements, and.

DETAILED DESCRIPTION

Figure 1:
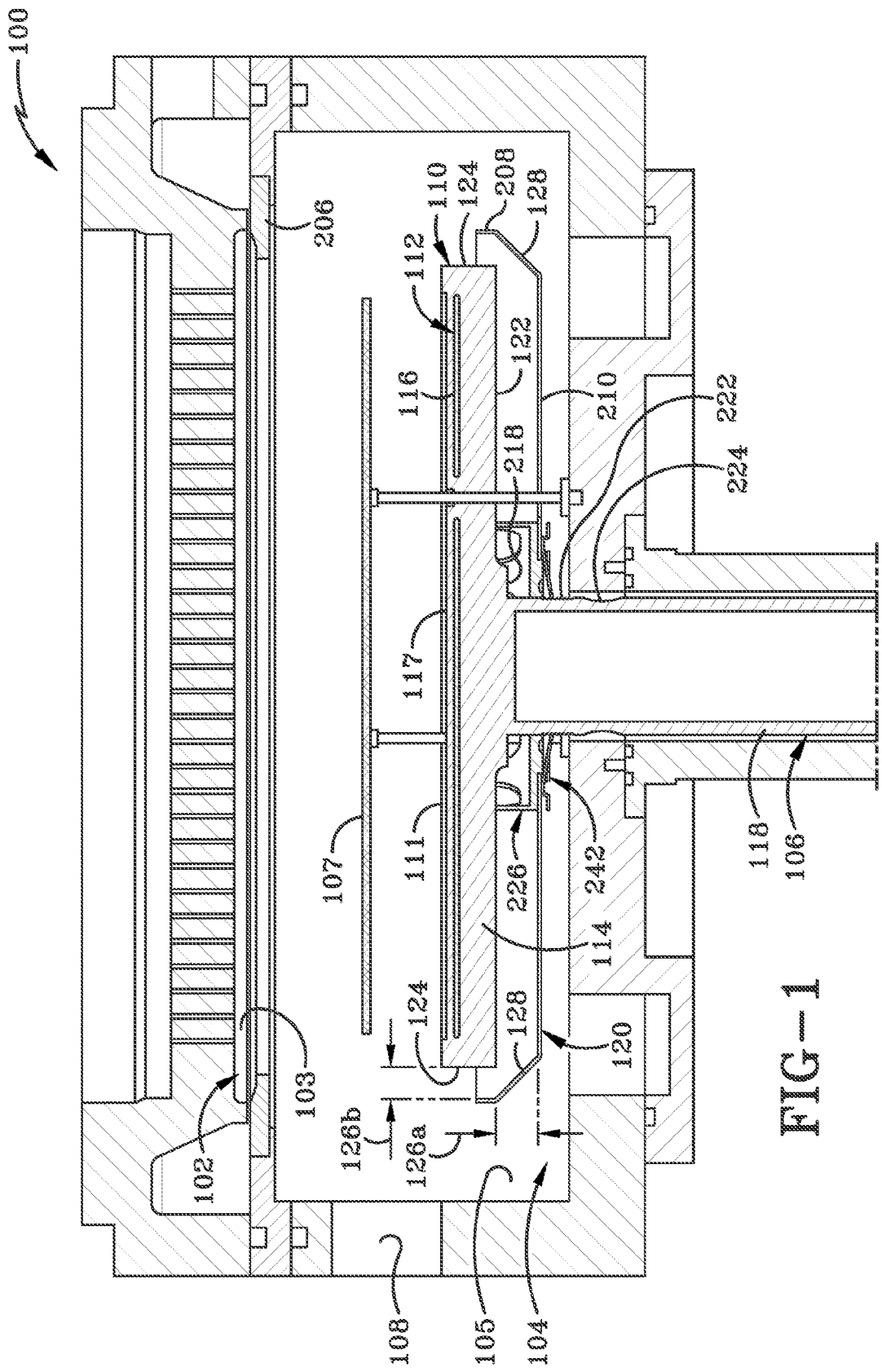
FIG. 1 schematically shows a substrate processing chamber including a radiation shield according to an embodiment of the present disclosure in the substrate loading position.

Some substrate processing tools may include environments that vary in the amount of incident radiation reflected therein. For example, various materials, surface finishes, surface coatings, and/or environmental geometries may affect an amount of thermal radiation reflected within a substrate processing tool, potentially causing a non-uniform temperature field to develop within a substrate being processed in the substrate processing tool.

For example, a substrate being supported by a susceptor heater assembly that is heated by one or more resistive heaters may lose heat via thermal radiation to a low pressure environment within a substrate processing tool. Such radiative losses may increase as the temperature of the susceptor heater assembly increases. Further, because the area between a susceptor heater assembly and the surrounding low pressure environment may be non-uniform in some settings, the radiation capture properties of the substrate processing tool environment may affect the radiation loss from the susceptor heater assembly. In turn, a substrate subjected to an uneven radiation capture environment may develop a non-uniform temperature profile within the substrate. As used herein, radiation capture refers to an object's or an environment's ability to capture thermal radiation. Because some substrate processing operations may depend on temperature, such non-uniform temperature profiles may lead to non-uniformities in the processed substrate. For example, a semiconductor substrate subjected to a film deposition process may exhibit a convex, concave, or skewed film thickness profile as a result of the non-uniform temperature that may produce defects and may lead to defective semiconductor devices.

Some previous approaches to reduce the effect of the surrounding radiation capture environment on within-substrate temperature fields have employed fixed radiation shields positioned within portions of processing tools. However, such fixed shields frequently have gaps to allow substrate transfer robots to move substrates within the tool, or that otherwise provide an incomplete and/or inconsistent radiation capture environment. In some other cases, such fixed shields may be irregularly formed so that there may be non-uniform view factors between the susceptor heater assembly and the fixed shield.

Accordingly, the disclosed embodiments relate to a radiation shield positioned to reflect thermal radiation (including one or more wavelengths of infrared radiation) and/or heat emitted from a susceptor heater assembly used for supporting and heating a substrate within a substrate processing chamber. For example, the disclosed embodiments provide a radiation shield supported by a structure used to move the susceptor heater assembly within a substrate processing chamber so that the radiation shield moves with the susceptor heater assembly as the susceptor heater assembly is moved from a first position to a second position within the substrate processing chamber. As another example, the disclosed embodiments provide a radiation shield coupled to a susceptor heater assembly where the radiation shield is configured to reflect thermal radiation and/or heat emitted by the susceptor heater assembly to at least two different sides of the susceptor heater assembly. By maintaining a predetermined radiation capture environment (in some embodiments, a uniform radiation capture environment), such radiation shields may enhance within-substrate temperature uniformity. In turn, within-substrate processing uniformity (e.g., deposition rate, etch rate, and so on) may be enhanced, potentially enhancing substrate deposited film quality provided by the substrate processing chamber and/or at downstream processing operations. Further, in some examples, increasing an amount of thermal radiation and/or heat reflected to the susceptor heater assembly may reduce power consumed by a heater included in the susceptor heater assembly. Consequently, in some embodiments, enhanced heater control and/or lifetime may be realized. In addition, a reduction in chamber cleaning frequency may also be obtained.

FIG. 1 schematically shows a cross-section of an embodiment of a substrate processing chamber 100 for processing semiconductor substrates in a substrate loading/unloading position. In some embodiments, substrate processing chamber 100 may be included in a suitable substrate processing tool. Substrate processing chamber 100 may be used for processing semiconductor substrates via any suitable process, e.g., film deposition, film etch, and the like. While the embodiment of substrate processing chamber 100 depicted in FIG. 1 shows a single chamber, it will be appreciated that any suitable number of process chambers may be included in a processing tool so that substrates may be transferred between process chambers without being exposed to ambient conditions. For example, some processing tools may include just one chamber while other processing tools may include two or more chambers. In these examples, each reaction chamber may include only a single region or a plurality of regions. While not shown in FIG. 1, various load locks, load ports, and substrate transfer handling robots may be used to transfer substrates between ambient conditions and substrate processing chamber 100 before, during, and after substrate processing.

Figure 2:
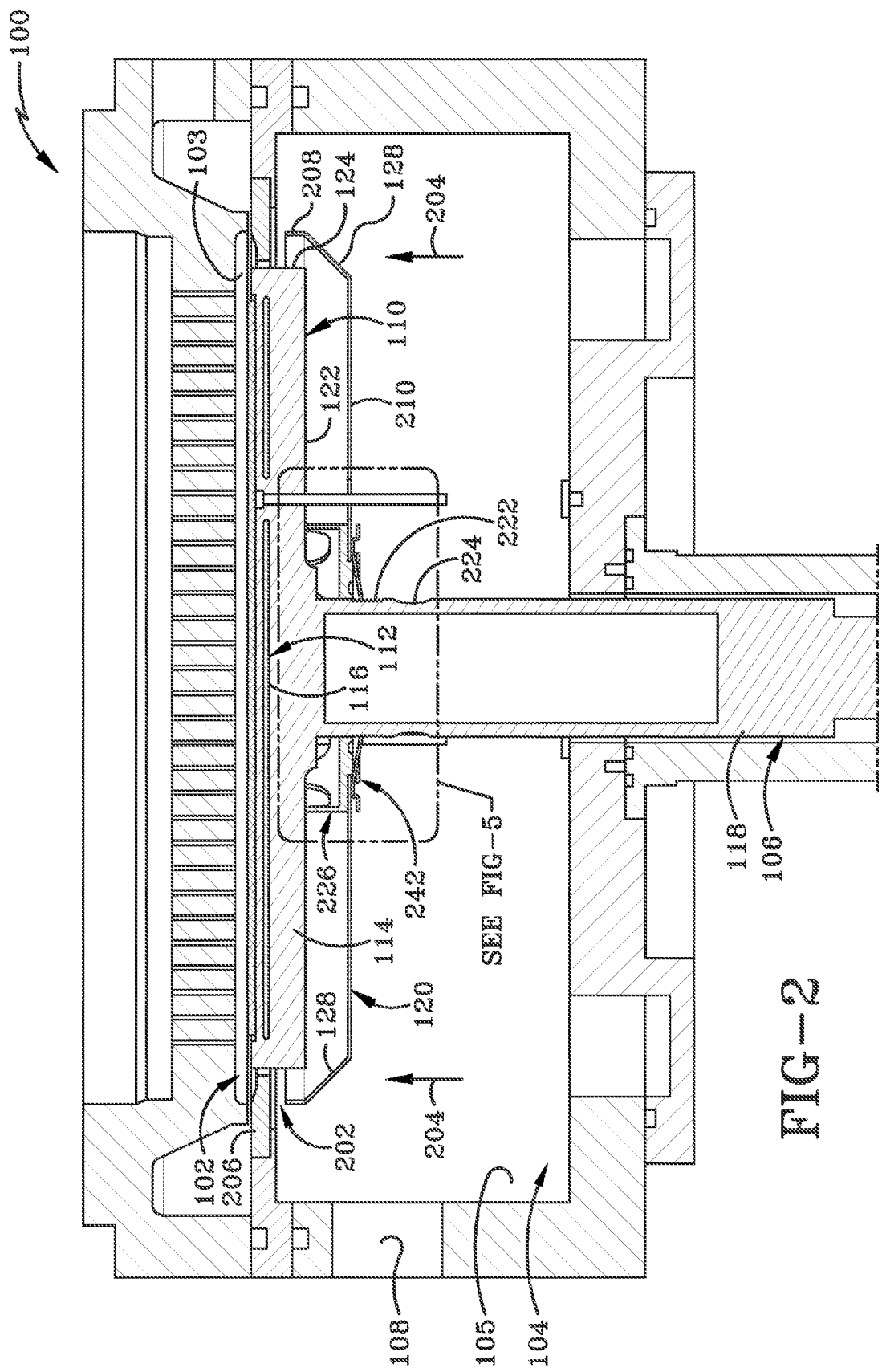
FIG. 2 schematically shows a substrate processing chamber including a radiation shield according to an embodiment of the present disclosure in the substrate processing position.

As shown in FIGS. 1 and 2, substrate processing chamber 100 includes an upper reactor 102 within which a reaction zone or processing region 103 is formed where substrate processing occurs. Substrate processing chamber 100 also includes a lower reactor 104 with a substrate loading region 105 where substrate transfer operations are performed. FIG. 1 also shows a movable pedestal 106 used to support a substrate within substrate processing chamber 100. The embodiment shown in FIG. 1 depicts pedestal 106 in a lowered position within lower reactor 104. In some settings, pedestal 106 may be placed in a lowered position as a part of transferring a substrate 107 in or out of substrate processing chamber 100.

In the embodiment shown in FIG. 1, lower reactor 104 includes a substrate transfer opening 108 through which substrates are transferred in and out of substrate processing chamber 100. In some embodiments, a gate valve (not shown) may be coupled to substrate transfer opening 108 so that substrate processing chamber 100 may be isolated from other portions of a semiconductor processing tool and/or so that substrate processing chamber 100 may be pumped down to a pressure below an ambient pressure (e.g., to a low pressure state).

In the example shown in FIG. 1, pedestal 106 comprises a susceptor heater assembly 110 for supporting a substrate within substrate processing chamber 100. Susceptor heater assembly 110 includes a heater assembly 112 used to adjust a temperature of the substrate before, during, and/or after substrate processing. In some embodiments, heater assembly 112 may include a resistive platen heater. In the embodiment shown in FIG. 1, heater assembly 112 includes a base 114 and a substrate supporting portion. In some embodiments, base 114 may include one or more channels configured to retain one or more resistive heating elements 116 may be positioned within base 114. In some other embodiments, heater assembly 112 may be a one-piece heater, multiple pieces fused/welded together, or a heater separable from a substrate support. Susceptor heater assembly 110 is mounted on an elevator 118 so that the substrate may be raised and lowered. In some embodiments, heater assembly 112 may be welded to elevator 118. Nevertheless, any suitable heating arrangements may be utilized within the reaction chamber.

Susceptor heater assembly 110 is depicted in FIG. 1 as including an optional substrate support surface 111 configured to support substrate 107. In some embodiments, substrate support surface 111 may be omitted, so that substrate 107 may be supported by a substrate pocket 117 formed into heater assembly 112. As shown in FIG. 1, substrate pocket 117 may be formed into an upper surface of substrate supporting surface of heater assembly 112 or alternatively in an upper surface of a substrate support or susceptor. In some other embodiments where heater assembly 112 includes a one-piece heater, a substrate pocket may be formed into an upper surface of the one-piece heater, so that substrate 107 rests directly on the one-piece heater.

FIG. 1 also shows a radiation shield 120 coupled to susceptor heater assembly 110 via elevator 118. Radiation shield 120 is configured to reflect at least a portion of thermal radiation emitted from susceptor heater assembly 110 back toward susceptor heater assembly 110. In some embodiments, radiation shield 120 may be configured to reflect thermal radiation and/or heat emitted by susceptor heater assembly 110 to at least two different sides of susceptor heater assembly 110. For example, FIG. 1 shows radiation shield 120 adapted to reflect some of the thermal radiation and/or heat emitted from bottom surface 122 and side surface 124 of susceptor heater assembly 110 back to susceptor heater assembly 110. This potentially may reduce power consumption by heater assembly 112 and/or reduce within-substrate temperature non-uniformities that may result from an uneven radiation capture and/or reflection environment near susceptor heater assembly 110. Further, in some embodiments, radiation shield 120 may be configured so that surfaces of radiation shield 120 reflect thermal radiation and/or heat to at least two different sides of heater assembly 112. For example, in the embodiment shown in FIG. 1, radiation shield 120 is depicted as extending beyond heater assembly 112 so that thermal radiation and/or heat is reflected to side and/or bottom surfaces of heater assembly 112. While creating non-uniformity may be a goal, this same arrangement may be used to exaggerate a non-uniformity as may be desired during processing of a substrate.

In the embodiment shown in FIG. 1, radiation shield 120 is shaped and sized so that radiation shield 120 is separated from susceptor heater assembly 110 by a gap. Spacing radiation shield 120 and susceptor heater assembly 110 may help maintain an even radiation capture environment around susceptor heater assembly 110. It will be appreciated that a distance separating radiation shield 120 from susceptor heater assembly 110 may vary according to processing conditions (e.g., susceptor heater assembly temperatures, process pressures, etc.). For example, as pressure increases, thermal convection and/or conduction heat transfer processes may affect temperature fields within the substrate. A closer view of example spacing between radiation shield 120 and susceptor heater assembly 110 may be seen in FIG. 2, which schematically shows an embodiment of radiation shield 120 in a raised position within substrate processing chamber 100.

For example, a vertical gap 126a that defines a space between bottom surface 122 and radiation shield 120 and a horizontal gap 126b that defines a space between side surface 124 and radiation shield 120. In one implementation, vertical gap 126a is between 5 and 20 mm, preferably between 10 and 20 mm, while horizontal gap 126b is between 5 and 15 mm, preferably 7 and 12 mm. In one implementation, vertical gap 126a is approximately 17.25 mm, while horizontal gap 126b is approximately 9 mm. Nevertheless, shield 120 may be positioned any suitable distance from the bottom surface 122 and the side surface 124 without departing from the spirit and scope of the disclosure.

In some embodiments, such gaps may define a constant separation between radiation shield 120 and susceptor heater assembly 110 within an acceptable tolerance. Such constant separation may provide a uniform radiation capture and/or reflection environment for susceptor heater assembly 110, potentially resulting in uniform temperature profile within susceptor heater assembly 110 and/or substrate 107 supported thereon. For example, in a scenario where a circularly symmetric substrate is supported on a circularly symmetric substrate heater assembly, positioning a radiation shield to create a circularly symmetric radiation capture and/or reflection environment around the susceptor heater assembly may result in a circularly symmetric temperature profile within the substrate. In turn, a temperature of the substrate, measured at a fixed radial distance from a center of the substrate, may be independent of polar angle.

It will be appreciated that, in some embodiments, such separation between radiation shield 120 and susceptor heater assembly 120 may vary. For example, separation between susceptor heater assembly 110 and radiation shield 120 may vary locally to offset emissivity variations of susceptor heater assembly 110 and/or radiation shield 120 and/or to accommodate various fittings, sensors, and/or other hardware features. For example, FIG. 2 depicts a chamfered surface 128 formed into radiation shield 120, which may assist with clearance of various hardware fittings within lower reactor 104 as susceptor heater assembly 110 is raised and lowered. In some embodiments, a distance between chamfered surface 128 and susceptor heater assembly 110 may be less than a distance defining vertical gap 126a and/or horizontal gap 126b.

FIG. 2 also shows a space 202 formed between radiation shield 120 and upper reactor 102. In some embodiments, space 202 may be sized to provide a preselected thermal radiation reflectance from radiation shield 120 while also providing a predetermined gas flow conductance between upper reactor 102 and lower reactor 104 via space 202 when the pedestal is in a raised position, such as during substrate processing shown in FIG. 2. Thus, space 202 may be sized to provide a desired radiation capture and/or reflection environment for susceptor heater assembly 110 without sealing radiation shield 120 to upper reactor 102. This may provide differential pumping via space 202 among other portions of substrate processing chamber 100. In some embodiments, however, radiation shield 120 may be configured to fit snugly against upper reactor 102. In one non-limiting example, space 202 may be approximately 5 mm to 10 mm, and preferably 8.25 mm in one implementation. Specifically, an isolation device 206 may be positioned co-planar with an outer surface of shield 120. The outer surface of shield 120 may include a sidewall 208 and a bottom wall 210 which may be connected by a chamfered surface 128. The chamfered surface 128 may be positioned at an angle between approximately 25 and approximately 65 degrees, or as will described below, at an angle of approximately 90 degrees without a chambered surface.

Referring to FIG. 1, susceptor heater assembly 110 is shown in a first position with the susceptor heater assembly 110 in a lower position and lift pins extending above a top surface of the susceptor support surface 111. The lift pins are arranged to receive a substrate 107 on the lift pins. Moving to FIG. 2, the susceptor heater assembly 110 is moved upwards in the direction associated with arrows 204 until the susceptor support surface 111 is within the upper chamber 102 and forms at least a portion of a first region. A second region is formed by the inner surface of shield 120, while the third region is formed by the lower chamber 104. In this arrangement, the second region may be wholly contained within the third region, or only partially contained within the third region.

Figure 3:
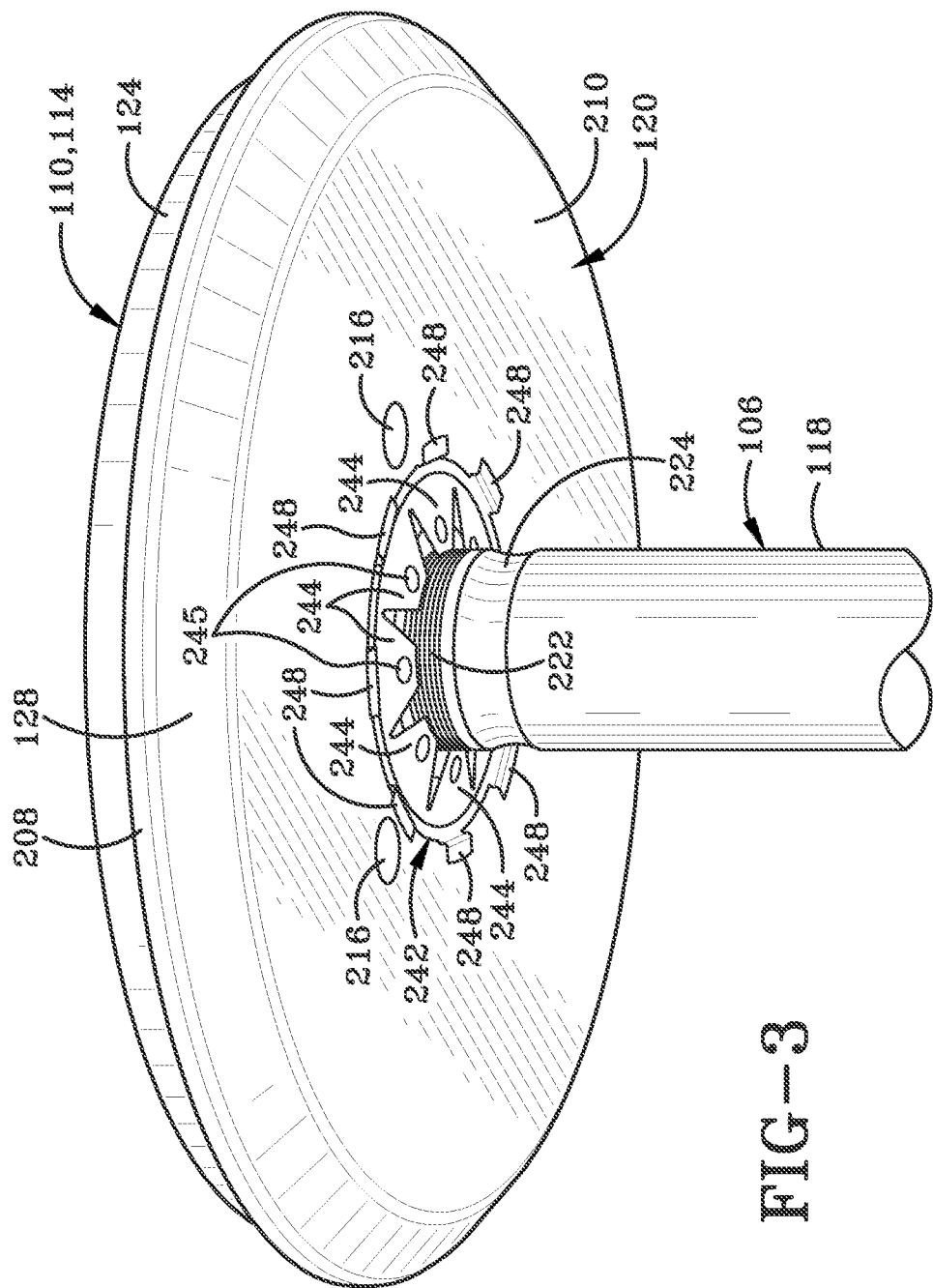
FIG. 3 schematically shows a bottom perspective view of a portion of the radiation shield illustrated in FIG. 1.

In some embodiments, radiation shield 120 may be supported by elevator 118 and retained by one or more retaining structures. In some embodiments, such retaining structures may include suitable clips. FIG. 3 schematically shows an embodiment of pedestal 106 in a raised position.

Figure 4:
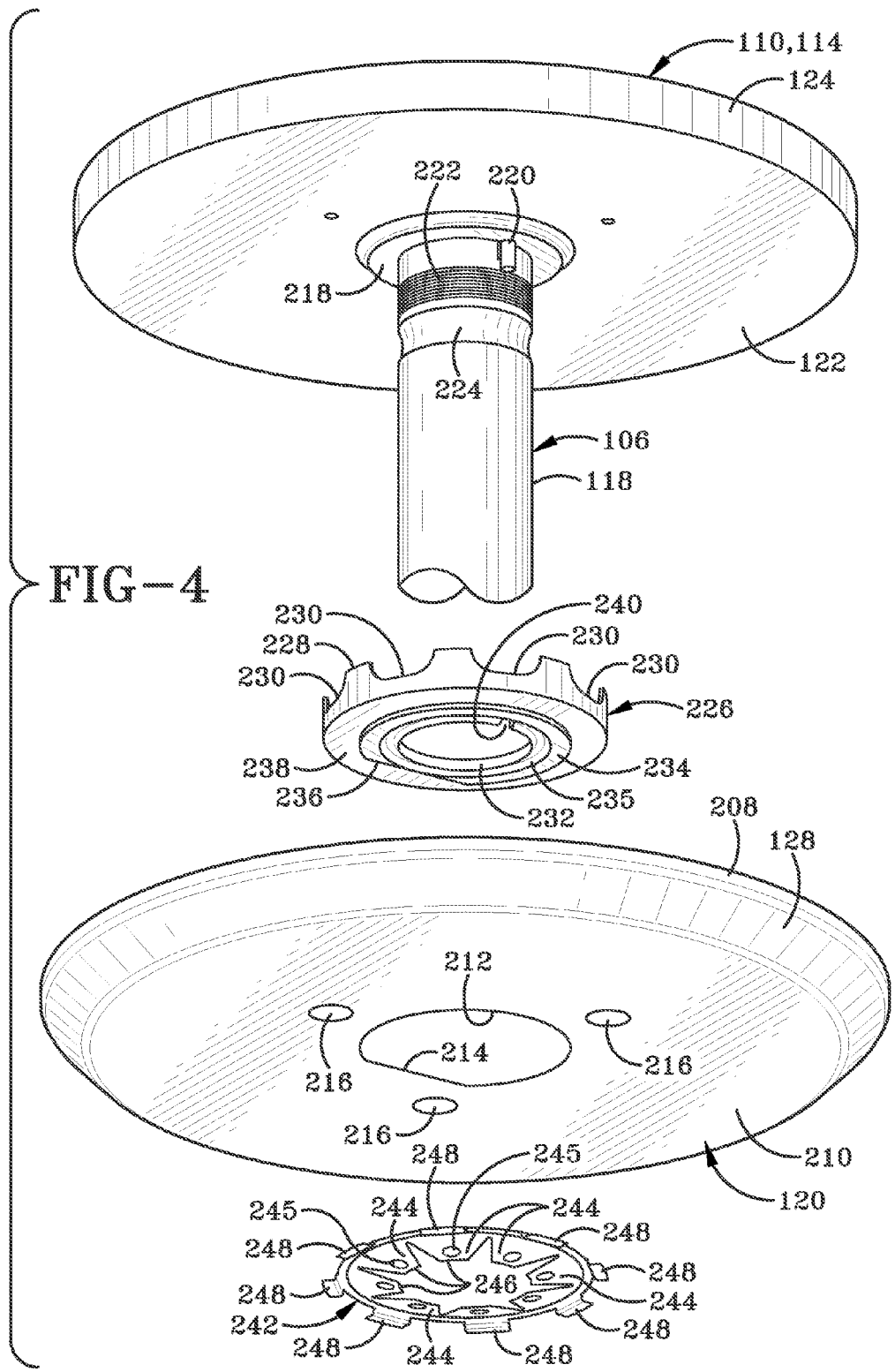
FIG. 4 schematically shows a perspective exploded view of the radiation shield illustrated in FIG. 1.

FIGS. 3 and 4 illustrate examples of the shield 120 and an attachment apparatus for securing the shield to the susceptor heater assembly 110. Specifically, shield 120 may include a central aperture 212 with a flat surface 214 arranged to assist with securing the shield to the elevator 118. Shield 120 may also include a plurality of holes 216 to permit the lift pins to pass there through. Susceptor heater assembly 110 may also include a raised portion 218 having a flat receiving portion facing shield 120. An alignment tab 220 may be located on elevator 118 above a grooved or teeth portion 222, which is in turn above a concave portion 224.

A spacer 226 is used to assist with alignment of the shield 120 and susceptor heater assembly 110. The spacer 226 may include a top surface 228 with concave surfaces 230 therein. The spacer 226 may include an opening 232 and an alignment protrusion 234 having a flat surface 236, both extending from a bottom surface 238 of the spacer. A groove 235 may be positioned radially inward of alignment protrusion 234 and arranged to receive release pins as will be discussed below. Finally, the spacer may also include an alignment aperture 240 for cooperation with alignment tab 220 of the elevator 118. Accordingly, the spacer 226 is aligned with elevator 118 at alignment aperture 240 and alignment tab 220, which is in turn aligned with alignment protrusion 234. Shield central aperture 212 and flat surface 214 are aligned with alignment protrusion 234 and flat 236 of spacer 226 to thereby orient the susceptor heater assembly 110, spacer 226, and shield 120 for proper operation.

FIGS. 3 and 4 illustrate a locking clip 242 having a plurality of engagement protrusions 244 extending generally inward and each having an engagement surface 246 together defining an interior perimeter which is slightly smaller than an outer surface of elevator 118 and specifically grooved portion 222. The locking clip 242 may also include a plurality of release tabs 248 extending outward from the outer perimeter of the locking clip. Each of the engagement protrusions 244 may include a mounting hole 245 for receiving release pins as will be discussed below in greater detail.

Radiation shield 120 may have any suitable shape. For example, in some embodiments where susceptor heater assembly 110 has a circular profile for supporting a circularly-shaped substrate, radiation shield 120 may be circularly-shaped so as to provide a uniform thermal radiation reflection and/or absorption environment. However, it will be appreciated that in some embodiments, radiation shield 120 may have other suitable shapes, such as polygonal shapes, as the shape of radiation shield 120 may be influenced by heat transfer considerations as well as geometric influences.

Radiation shield 120 may be formed from any suitable material. Non-limiting examples include aluminum, stainless steel, and titanium. Further, it will be appreciated that radiation shield 120 may be formed in any suitable manner. In some embodiments, radiation shield 120 may be formed by metal spinning Other suitable fabrication techniques include casting, stamping, and turning. In some embodiments, radiation shield 120 may include suitable surface treatments and/or surface finishes configured to alter one or more radiation reflectivity characteristics of the material from which it is formed. Such treatments and finishes may be configured to reflect thermal radiation locally (e.g., toward susceptor heater assembly 110, in some examples) or globally. For example, radiation shield 120 may include a highly polished surface adapted to reflect thermal radiation in some embodiments. Additionally or alternatively, in some embodiments, radiation shield 120 may include surface treatments configured to reflect one or more wavelengths of infrared radiation. Further, in some embodiments, radiation shield 120 may be assembled by any suitable technique. For example, in some embodiments, radiation shield sub-assemblies may be welded together or removably connected together.

Figure 5:
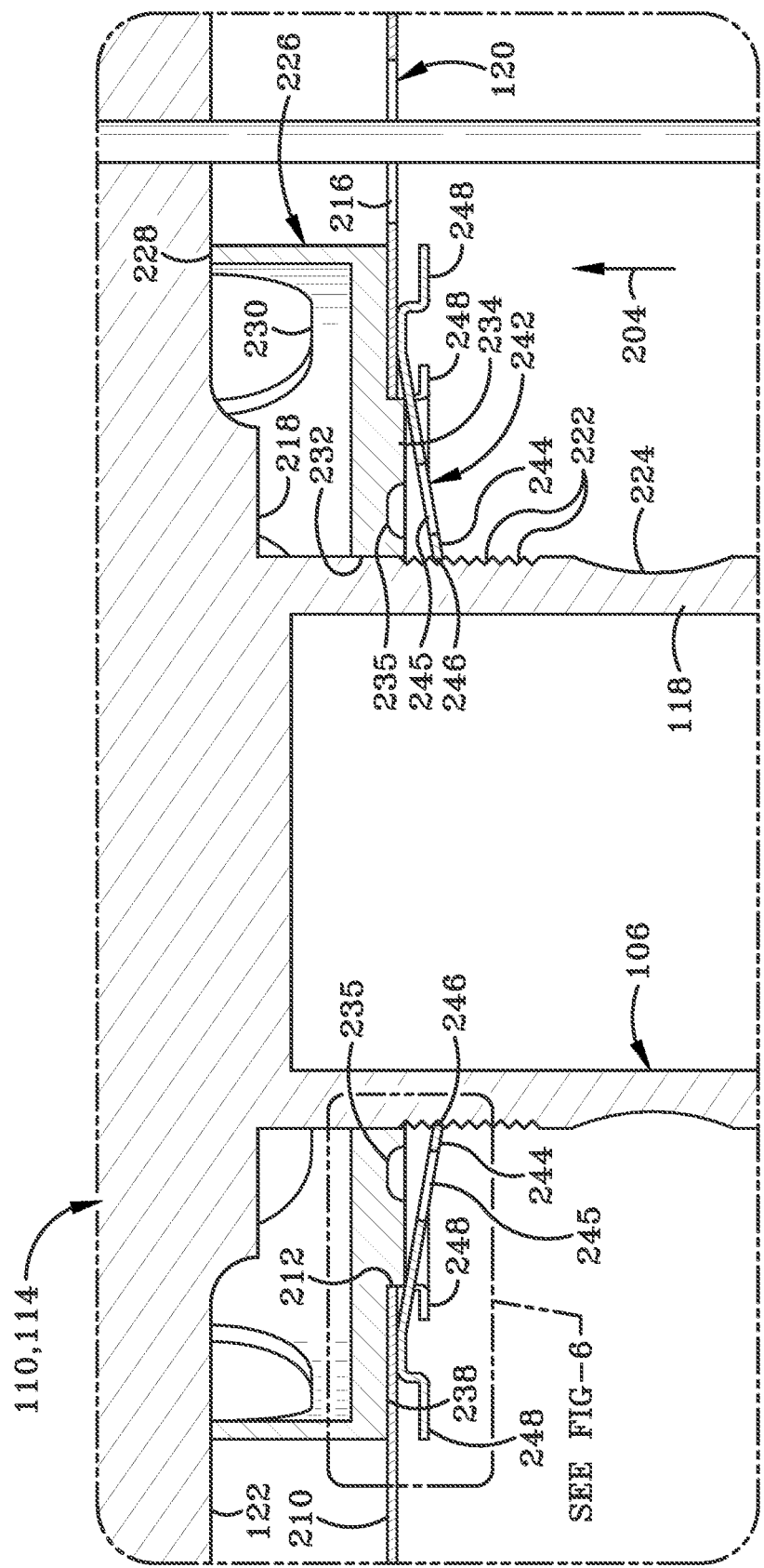
FIG. 5 schematically shows a sectional view of the area labeled FIG. 5 in FIG. 2.
Figure 6:
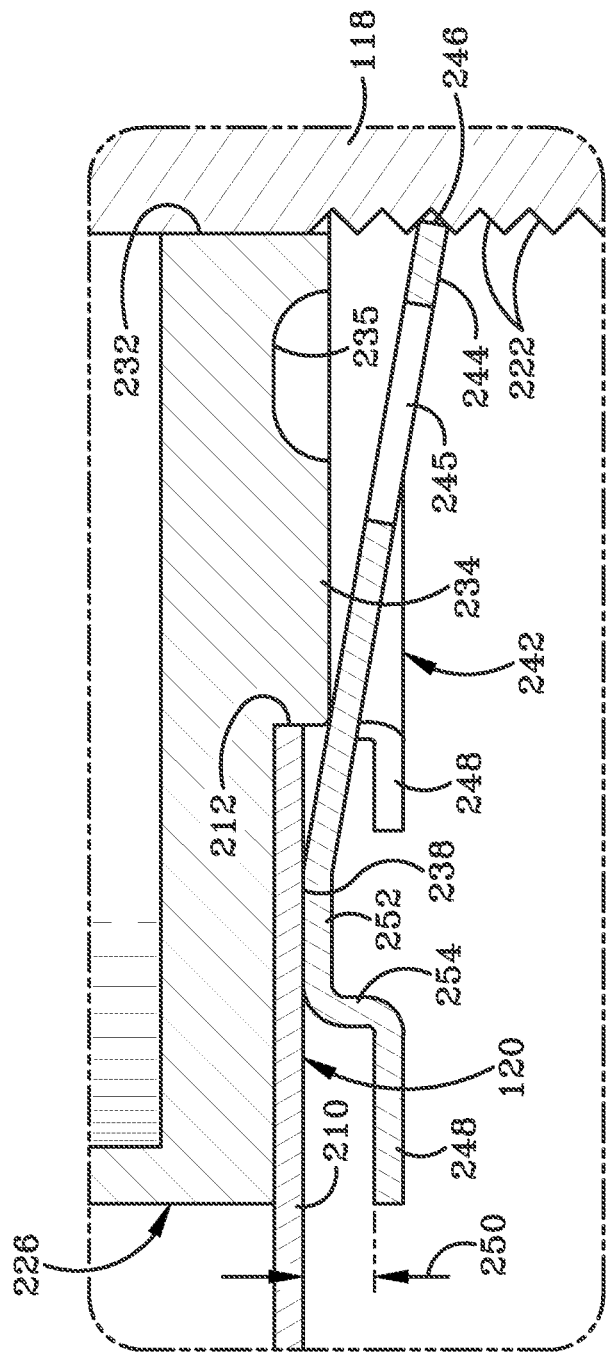
FIG. 6 schematically shows a sectional view of the area labeled FIG. 6 in FIG. 5.
Figure 7:
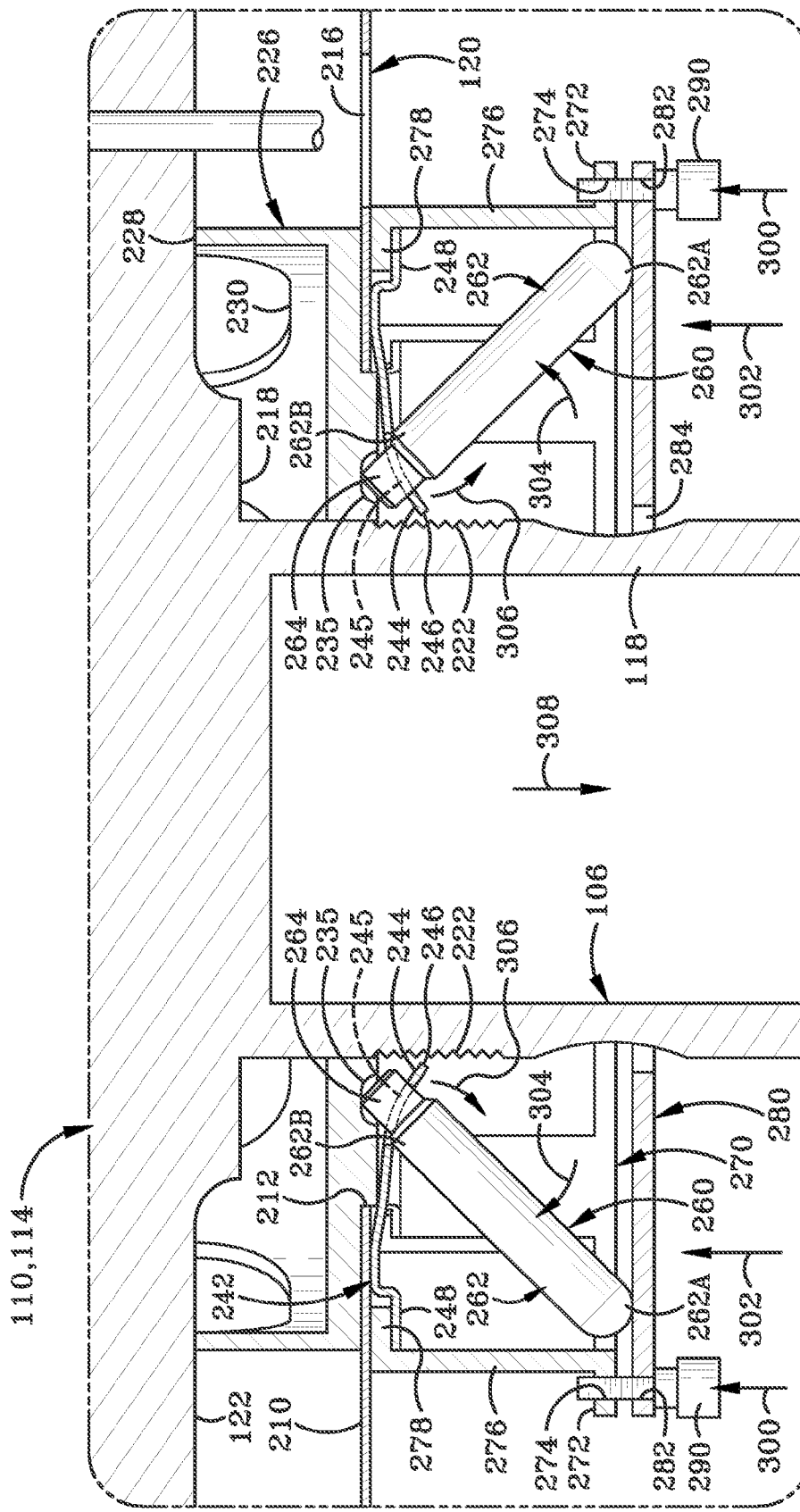
FIG. 7 schematically shows a sectional view of the area labeled FIG. 5 in FIG. 2 and the removal of the radiation shield.

FIGS. 5 through 7 illustrate various operational views of the installation and removal of the shield 120 and specifically the locking clip 242. As shown in FIG. 5, spacer 226 is moved in the direction associated with arrow 204 until the alignment tab 220 and alignment aperture 240 are engaged, such that spacer 226 is arranged to receive shield 120 moved upwards in the direction associated with arrow 204 until the shield central aperture 212 and flat surface 214 are aligned with and in contact with spacer bottom surface 238. Next, locking clip 242 is also moved upwards along elevator 118, with engagement protrusions 244 bent downwards as the locking clip is moved upwards. Specifically, since the engagement surfaces 246 of the engagement protrusions 244 define an interior perimeter that is smaller in diameter than elevator 118 outer perimeter, there is a frictional engagement between elevator 118 and engagement protrusions 244, which requires that the engagement protrusions 244 are essentially pulled upwards by the vertical movement of the locking clip 242. When the locking clip engagement protrusions 244 and engagement surfaces 246 contact grooved portion 222, the engagement protrusions 244 fit within grooved portion 222 and only permit movement upwards in the direction associated with arrow 204, thereby preventing unlocking or separation of the locking clip, shield, and spacer from the susceptor heater assembly 110.

Referring now to FIG. 6, which is an enlarged sectional view of the section labeled FIG-6 in FIG. 5. As can be seen in greater detail, release tabs 248 are spaced apart by a gap 250 formed between the release tabs and the shield 120. A mounting surface 252 is located on a top side of locking clip 242 and contacts bottom wall 210 of shield 120 to secure the shield to the spacer and ultimately the susceptor heater assembly 110. The locking clip 242 may also include a spacing wall 254 which provides the gap 250 between release tabs 248 and the bottom wall 210 of shield 120. Advantageously, the gap 250 permits removal of the locking clip 242, the shield 120, and the spacer 226 by allowing a user to locate his/her fingers or a tool in gap 250 as will be discussed in greater detail below.

FIG. 7 illustrates the removal of locking clip 242, the shield 120, and the spacer 226 being removed with a removal tool 260 generally includes release pins 262 having a first end 262a and a second end 262b, with second end 262b removably positionable within mounting holes 245 to bias engagement protrusions 244 in the direction associated with arrows 306. Specifically, Second end 262b includes a recessed area 264 which is arranged to fit within mounting holes 245 and may extending into groove 235 as may be necessary. The removal tool also includes a clamping member 270 having a flange 272 with threaded holes 274 therein, a plurality of spacing members 276 with gripping arms 278 connected to spacing member 276 and opposite flange 272. Gripping arms 278 are preferably sized and shaped to fit within gap 250 between shield 120 and release tabs 248. In one implementation, clamping member 270 is arranged to be moved upwards in the direction associated with arrows 302 around the release tabs 248 and then rotated to be in contact with the release tabs and positioned in gap 250. The removal tool 260 also includes a washer 280 having a plurality of threaded apertures 282 for receiving bolts 290 and an aperture 284 so that the washer can travel around elevator shaft 118.

Having described all of the removal tool 260 components, the operation will now be described. Release pins 262 are positioned within mounting holes 245 with recessed area 264 positioned within groove 235 if necessary. Next, clamping mechanism is positioned so that gripping arms 278 are within gaps 250 between release tabs 248 and shield 120. The washer 280 is then placed in contact with pins 260 and particularly first end 262a of the release pins. Bolts 290 are then secured through threaded apertures 272 and 282 steadily around the perimeter of the washer so that washer 280 is pulled upwards in the direction associated with arrows 302 by rotational movement of bolts 290 to displace the bolts in the direction associated with arrows 300. The upward movement of washer 280 creates a rotational movement of release pins 262 and imparts rotational movement in the direction associated with arrows 304. The rotational movement in the direction associated with arrows 304 imparts a bending force on engagement protrusions 244 in the direction associated with arrows 306. Accordingly, the bending force 306 imparted on the engagement protrusions increases the interior perimeter 246 to a point that locking clip 242 can be moved in the direction associated with arrow 308 and removed from elevator 118. In the same manner, shield 120 may also then be removed with or without spacer 226. While the above description uses certain orders of operation and directions (upward or downward), any suitable order of operations may be utilized and the directions may be reversed if the removal operation is performed with susceptor assembly 110 on a bench and upside down with elevator 118 pointing upwards. Further, the installation process may require a similar operation and merely be performed in reverse order. It should also be noted and appreciated that a number of other shield attachment means may be utilized without departing from the spirit and scope of the disclosure so long as the shield is connected to the elevator or other suitable reactor components.

Figure 8:
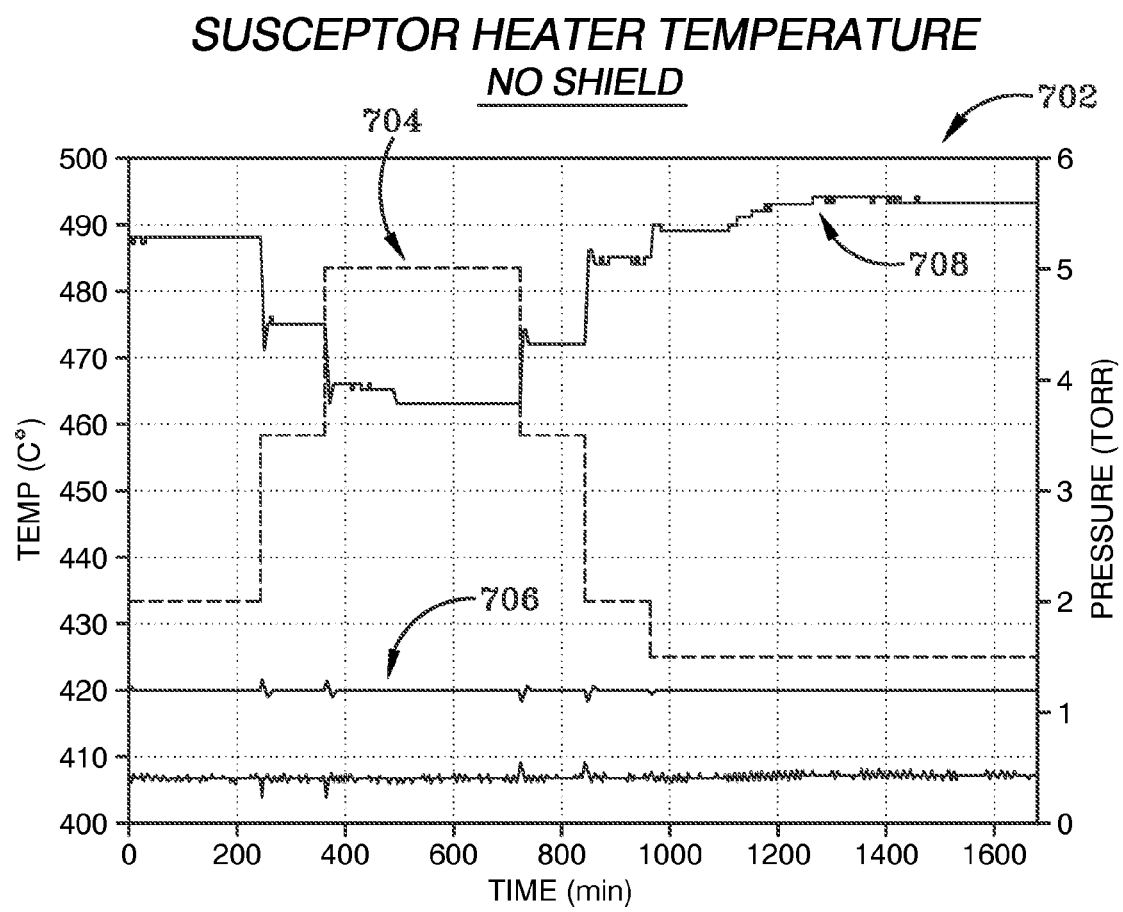
FIG. 8 shows example temperature data for a susceptor heater assembly without a radiation shield.
Figure 9:
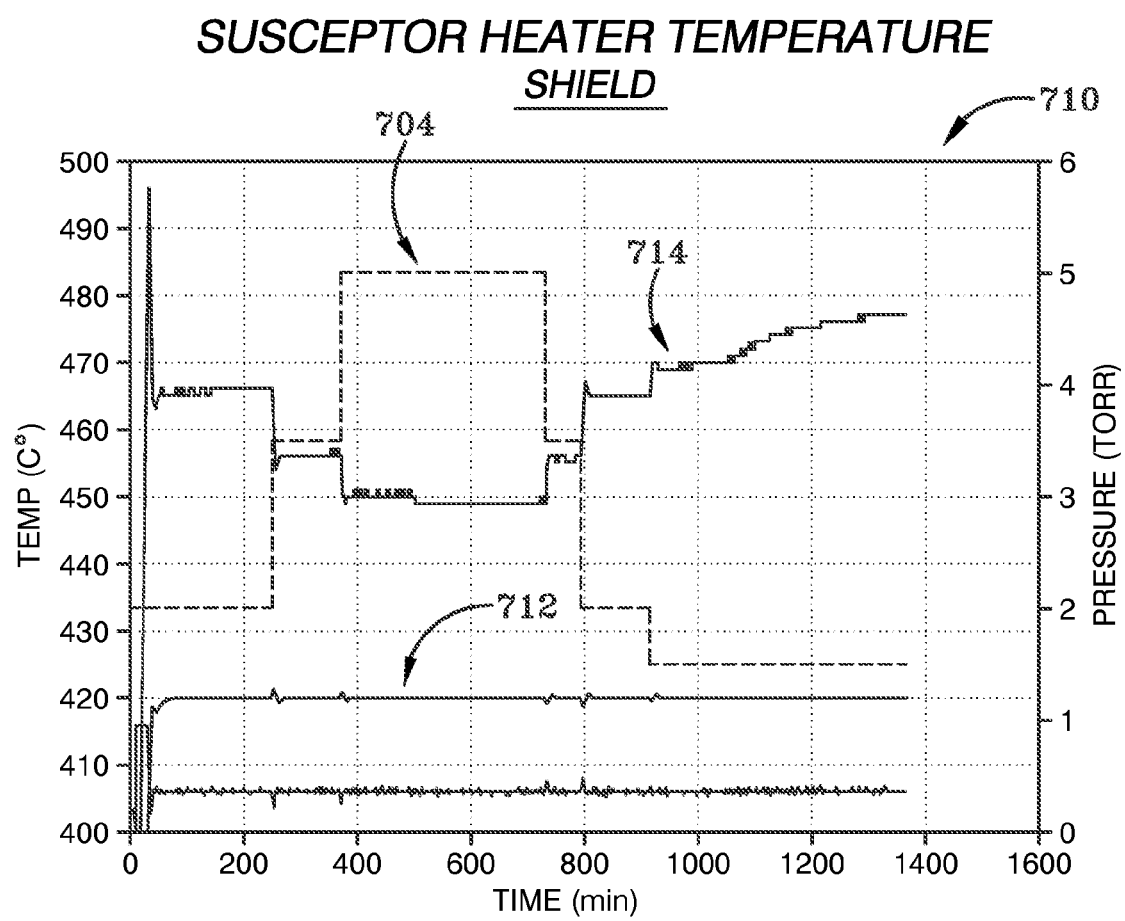
FIG. 9 shows example temperature data for a susceptor heater assembly with a radiation shield of the present disclosure.

In some settings, embodiments of radiation shields like those disclosed herein potentially may reduce power consumed by a heater included in a susceptor or even with the susceptor separated from the heater. For example, FIGS. 8 and 9 show example temperature data for an unshielded susceptor heater assembly (shown as data 702) compared to temperature data for a susceptor heater assembly employing a radiation shield according to an embodiment of the present disclosure (shown as data 704). In the examples shown in FIGS. 8 and 9, the heater power is adjusted to control the temperature of the susceptor (shown as susceptor temperature setting 706 in FIG. 8) to a preselected value of 420° C. for example. Accordingly, heat lost from the susceptor heater assembly may cause the power consumed by the heater, and thus the heater temperature, to necessarily increase. The example temperature data shown in FIGS. 8 and 9 was collected in a reactor controlled to various pressure setpoints (shown as reactor pressure setting 708 in FIG. 8) between 1.5 and 5 Torr. As shown in FIG. 9, heater temperature 710 corresponding to the unshielded susceptor heater assembly was approximately 15° C. higher at 2 Torr and approximately 22° C. higher at 5 Torr relative to the heater temperature exhibited by the shielded susceptor heater assembly, as shown in heater temperature 712. Accordingly, it will be appreciated that radiation shielding according to the disclosed embodiments may reduce heater power consumption, which may increase heater service life, or to increase the ultimate substrate temperature for the same heater temperature since more heat from the heater is directed into the susceptor heater assembly and substrate.

Figure 10:
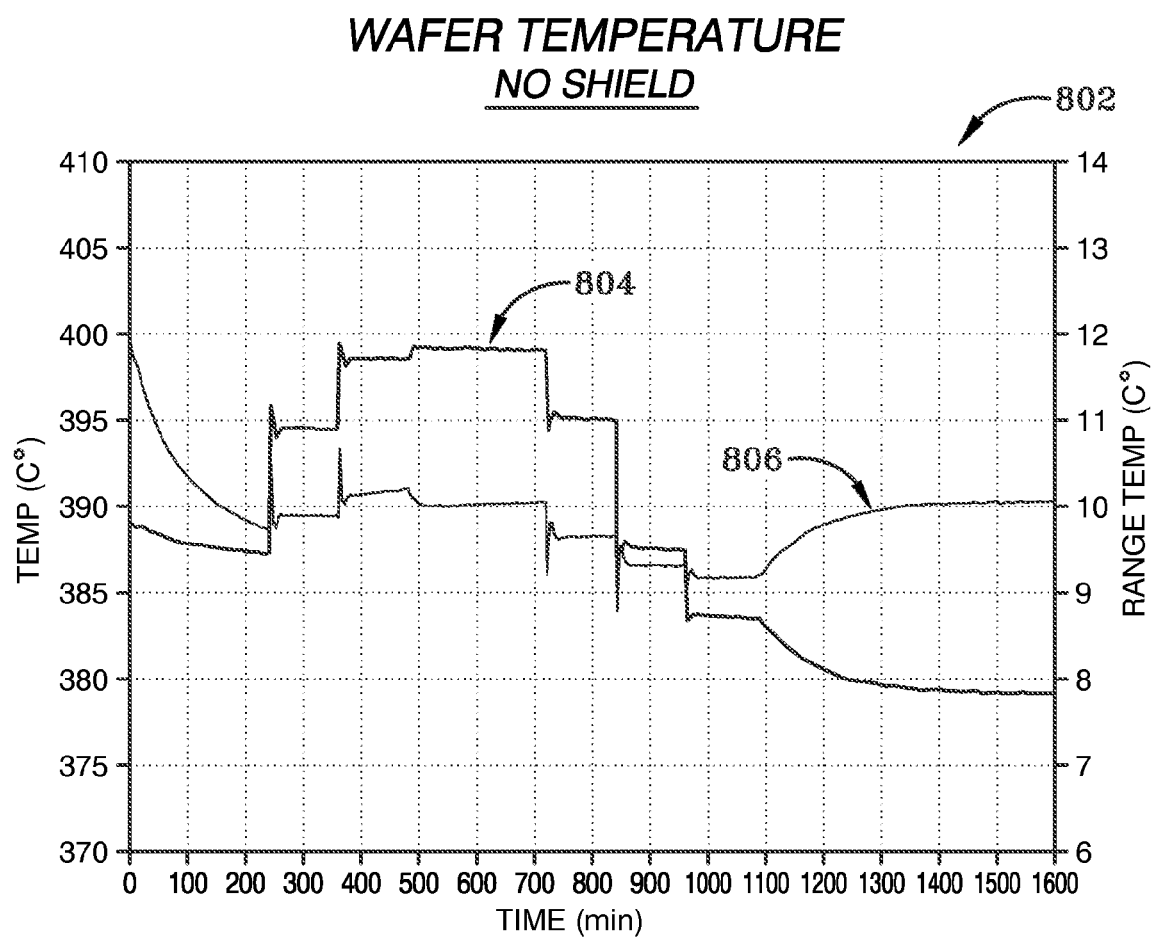
FIG. 10 shows example temperature data for a wafer substrate without a radiation shield.
Figure 11:
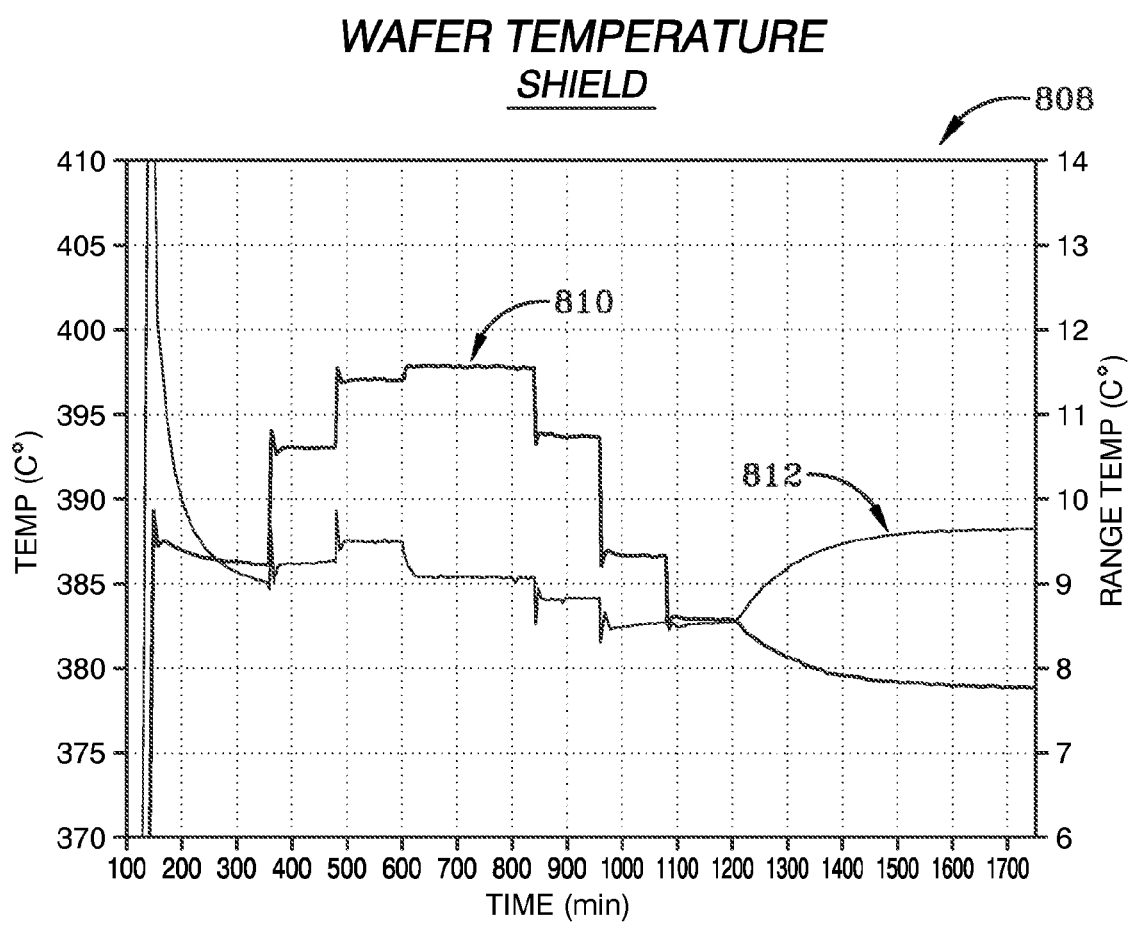
FIG. 11 shows example temperature data for a wafer substrate with a radiation shield.

Further, in some settings, embodiments of radiation shields like those disclosed herein potentially may enhance within-substrate temperature uniformity. For example, FIGS. 10 and 11 show example substrate temperature uniformity data for an unshielded susceptor heater assembly (shown as data 802) compared to substrate temperature uniformity data for a susceptor heater assembly employing a radiation shield according to an embodiment of the present disclosure (shown as data 804). In the examples shown in FIG. 10, the heater power is adjusted to control the temperature of the susceptor to a preselected value of 420° C. while the reactor was controlled to various pressure setpoints between 1.5 and 5 Torr. As shown in FIG. 10, a mean substrate temperature 806 corresponding to the unshielded susceptor heater assembly was approximately 1° C. higher than a mean temperature 808 corresponding to the shielded susceptor heater assembly. Further, a substrate temperature range 810 corresponding to the unshielded susceptor heater assembly was approximately 1° C. higher than a substrate temperature range 812 corresponding to the shielded susceptor heater assembly. Accordingly, shielding the susceptor heater assembly may, in some examples, decrease within-substrate temperature non-uniformities. This potentially may enhance substrate processing quality, and may enhance downstream substrate processing quality as well. Appendix A also shows embodiments of radiation shields according to the present disclosure and temperature data related thereto.

Figure 12:
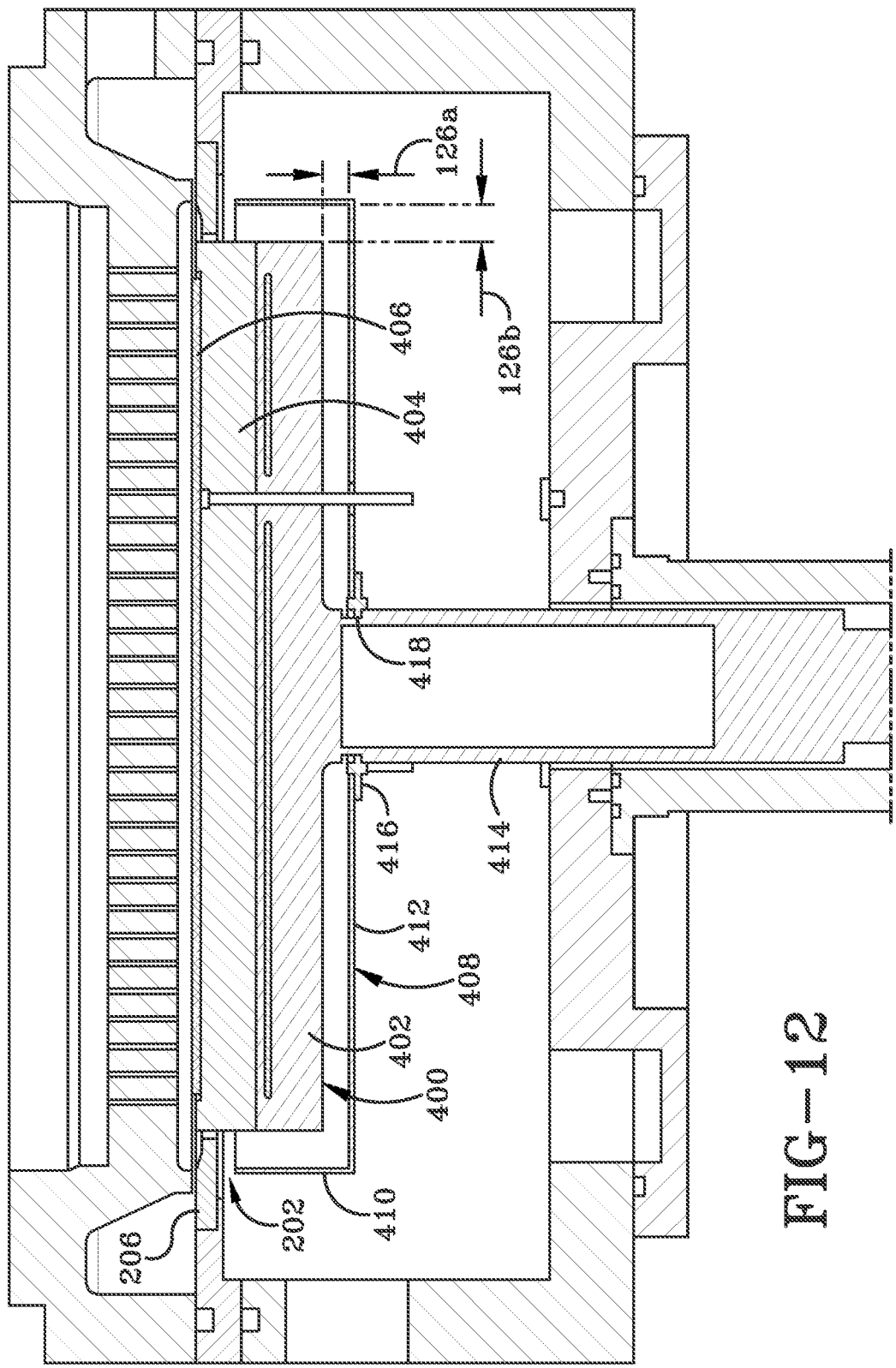
FIG. 12 schematically shows a sectional view of a second embodiment radiation shield of the present disclosure.

FIG. 12 illustrates another embodiment of a substrate support assembly 400 with a pedestal heater 402 and a separable susceptor 404 with a wafer 406 positioned on the susceptor. A shield 408 functions similar to shield 120 and includes a sidewall 410 and a bottom wall 412 positioned at approximately 90 degrees to one another. Shield 408 may be secured to a pedestal heater shaft 414 with a clip 416 selectively positioned in a recess 418 of the heater shaft. Accordingly, the arrangement, operation, and installation/removal of shields 120 and 408 are similar to one another and provide similar benefits of increased heater control, wafer heat distribution control, reduced power consumption, and less frequent chamber cleaning requirements.

Figure 13:
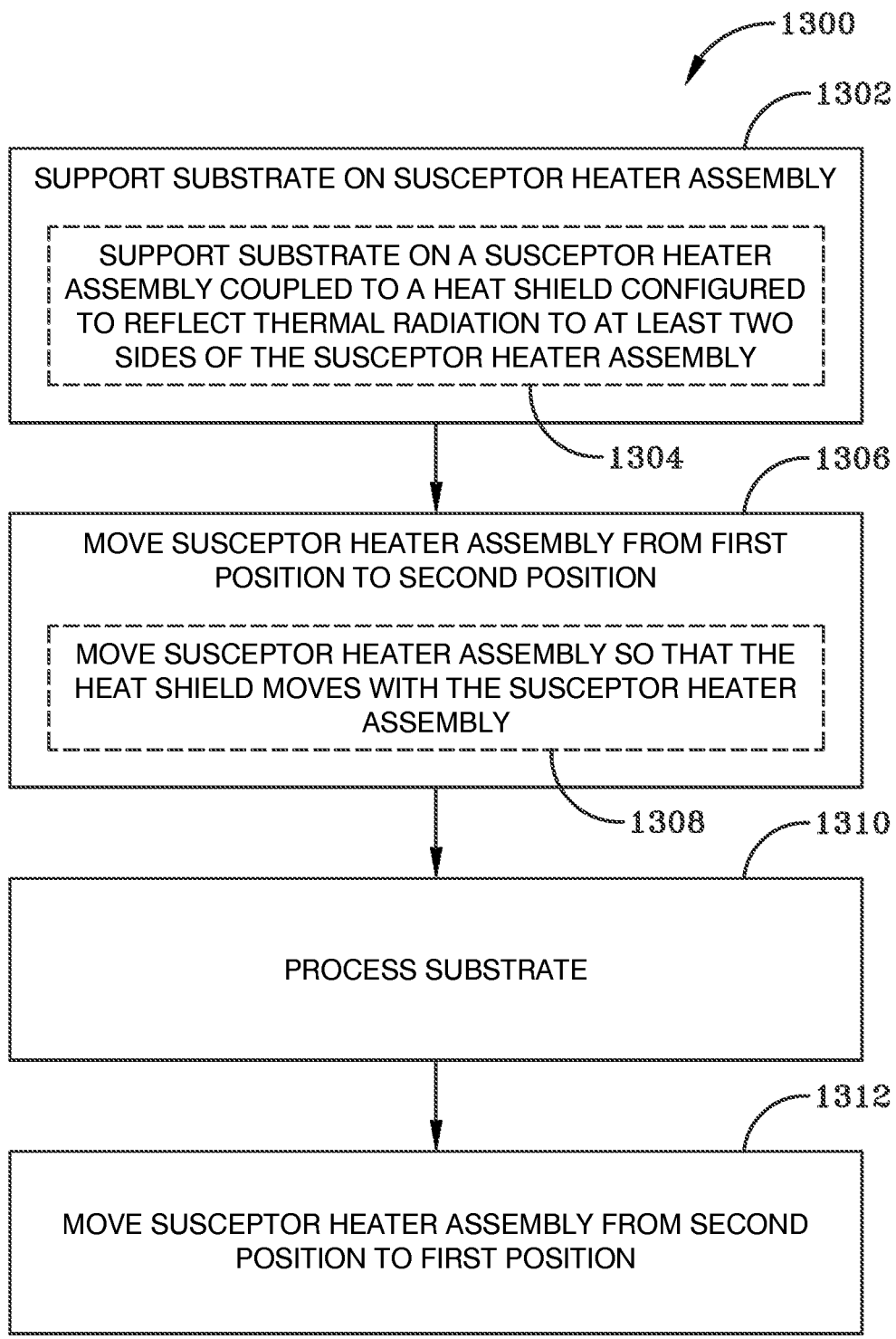
FIG. 13 shows a flow chart for a method of processing a substrate according to an embodiment of the present disclosure.

It will be understood that the hardware described herein may be used when processing substrates in a substrate processing chamber. FIG. 13 shows a flow chart for an embodiment of a method 1300 for processing a substrate in a substrate processing chamber. Method 1300 may be performed by any suitable hardware and software. It will be appreciated that portions of the processes described in method 1300 may be omitted, reordered, and/or supplemented without departing from the scope of the present disclosure.

At 1302, method 1300 includes supporting a substrate on a susceptor heater assembly. In some embodiments, method 1300 may include, at 1304, supporting a substrate on a susceptor heater assembly coupled to a radiation shield configured to reflect thermal radiation to at least two sides of the susceptor heater assembly. At 1306, method 1300 includes moving the susceptor heater assembly from a first position to a second position. In some embodiments, method 1300 may include, at 1308, moving the susceptor heater assembly so that a radiation shield moves with the susceptor heater assembly. At 1310, method 1300 includes processing the substrate. At 1312, method 1300 includes moving the susceptor heater assembly from the second position to the first position.

Embodiments of method 1300 may be performed by a system process controller comprising a data-holding subsystem comprising instructions executable by a logic subsystem to perform the processes described herein. Any suitable system process controller may be employed without departing from the scope of the present disclosure.

For example, a system process controller (not specifically shown) may be provided for controlling the example substrate processing chamber 100. The system process controller may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

The system process controller comprises a computing system that includes a data-holding subsystem and a logic subsystem. The data-holding subsystem may include one or more physical, non-transitory, devices configured to hold data and/or instructions executable by the logic subsystem to implement the methods and processes described herein. The logic subsystem may include one or more physical devices configured to execute one or more instructions stored in the data-holding subsystem. The logic subsystem may include one or more processors that are configured to execute software instructions.

In some embodiments, such instructions may control the execution of process recipes. Generally, a process recipe includes a sequential description of process parameters used to process a substrate, such parameters including time, temperature, pressure, and concentration, etc., as well as various parameters describing electrical, mechanical, and environmental aspects of the tool during substrate processing. The instructions may also control the execution of various maintenance recipes used during maintenance procedures and the like. In some embodiments, such instructions may be stored on removable computer-readable storage media, which may be used to store and/or transfer data and/or instructions executable to implement the methods and processes described herein. It will be appreciated that any suitable removable computer-readable storage media may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

We claim:

1. A reaction chamber comprising:
   a substrate supporting member comprising a shaft and positioned within the reaction chamber;
   the reaction chamber having a first region and a second region;
   a shield positioned within the second region and movable with the substrate supporting member; and,
   a spacer to space apart the shield and the substrate support member and to space apart the shield and the shaft,
   wherein the shield is adjacent at least a bottom surface of the substrate supporting member.

2. The reaction chamber of claim 1 wherein the shield is adjacent a sidewall of the substrate supporting member.

3. The reaction chamber of claim 1 wherein the first region is a substrate processing region and the second region is a substrate loading region.

4. The reaction chamber of claim 3 wherein the first region is positioned above the second region in the reaction chamber.

5. The reaction chamber of claim 1 further comprising an isolation device at least partially separating the first and second regions.

6. The reaction chamber of claim 5 further comprising a gap formed between the shield and the isolation device.

7. The reaction chamber of claim 6 wherein the gap is between 5 and 10 mm.

8. The reaction chamber of claim 1 wherein the shield is spaced from the substrate supporting member between 5 and 20 mm.

9. The reaction chamber of claim 1 wherein the shield further comprises a bottom member and a sidewall member.

10. The reaction chamber of claim 9 wherein the bottom member and the sidewall member connect to one another at an angle of approximately 90 degrees.

11. The reaction chamber of claim 9 wherein the bottom member and the sidewall member connect to one another at an angle between approximately 25 and 65 degrees.

12. The reaction chamber of claim 1 wherein the shield is secured to the shaft of the substrate supporting member.

13. The reaction chamber of claim 1 wherein the shield retains heat generated by the substrate support assembly.

14. The reaction chamber of claim 1 wherein the substrate support assembly further comprises a heater.

15. A shield for processing a substrate comprising:
    a bottom member having an aperture to surround a substrate support member shaft;
    a sidewall member extending upward at an angle from the bottom member;

wherein the bottom member is positioned below the substrate support member and the sidewall member is positioned around the substrate support member;

wherein the bottom member comprises a central aperture comprising a flat surface to assist securing the shield to a shaft of the substrate support member, and, wherein the shield moves vertically with the substrate support member.

16. The shield for processing a substrate of claim 15 wherein the shield is spaced from the substrate supporting member between 5 and 20 mm.

17. The shield for processing a substrate of claim 15 wherein the shield sidewall member does not contact a reaction chamber wall.

18. The shield for processing a substrate of claim 15 wherein the sidewall further comprises a top surface spaced from a reaction chamber surface between 5 and 10 mm.

19. A reaction chamber comprising:
a first region, a second region, and a third region;
the first region positioned above the second and third regions, and adapted for processing a substrate;
the second region positioned below the first region and adapted for loading the substrate in the reaction chamber;
the third region positioned between the first region and the second region; and
wherein the third region is movable via a shaft within the second region, and
wherein a shield removably attached to the shaft defines a barrier between the second region and the third region.

20. The reaction chamber of claim 19 further comprising a spacer further defining the barrier between the second region and the third region.

21. The reaction chamber of claim 20 wherein the shield is movable within the second region.

22. The reaction chamber of claim 21 wherein a third region volume varies based on a position of the substrate support member.

23. A method of heating a substrate in a processing region comprising:
providing a shield within the processing chamber below a substrate support member attached to a shaft;
providing a spacer to space apart the shield and the substrate sue sort member and to space apart the shield and the shaft;
loading a substrate in a processing region of the processing chamber;
activating a heater; and, radiating heat from the shield to the substrate support member.

24. The method of claim 23 further comprising the step of moving the substrate support member from a loading position to a processing position.

25. The method of claim 23 further comprising the step of monitoring the temperature of a cavity between the substrate support member and the shield.

* * * * *